(12) United States Patent
Nakata et al.

(10) Patent No.: US 7,256,102 B2
(45) Date of Patent: Aug. 14, 2007

(54) MANUFACTURING METHOD OF THIN FILM DEVICE SUBSTRATE

(75) Inventors: Mitsuru Nakata, Tokyo (JP); Kazushige Takechi, Tokyo (JP); Hiroshi Kanoh, Tokyo (JP)

(73) Assignee: NEC Corporation, Tokyo (JP)

( * ) Notice: Subject to any disclaimer, the term of this patent is extended or adjusted under 35 U.S.C. 154(b) by 251 days.

(21) Appl. No.: 10/976,846

(22) Filed: Nov. 1, 2004

(65) Prior Publication Data

US 2005/0095755 A1 May 5, 2005

(30) Foreign Application Priority Data

Oct. 30, 2003 (JP) .............................. 2003-370911

(51) Int. Cl.
*H01L 21/30* (2006.01)

(52) U.S. Cl. ................................. 438/458; 257/E21.57

(58) Field of Classification Search ................ 438/458, 438/487, 166; 257/E21.57
See application file for complete search history.

(56) References Cited

U.S. PATENT DOCUMENTS 6,521,511 B1 * 2/2003 Inoue et al. ................ 438/458

FOREIGN PATENT DOCUMENTS

| JP | 8-288522 | 11/1996 |
|---|---|---|
| JP | 11-26733 | 1/1999 |
| JP | 11-212116 | 8/1999 |
| JP | 2000-91604 | 3/2000 |

\* cited by examiner

*Primary Examiner*—Lex Malsawma
(74) *Attorney, Agent, or Firm*—Young & Thompson

(57) ABSTRACT

An object of the present invention is to prevent the thin film device formed by laser annealing from making, due to overheat, abnormal operations. Firstly, on a glass substrate 101. a heat insulating film, a silicon oxide film and an amorphous silicon film are formed in succession, and the amorphous silicon film is irradiated from above with a laser beam of an excimer laser. After being molten, the amorphous silicon film undergoes recrystallization to form a polycrystalline silicon film. Subsequently, using the polycrystalline silicon film as an active layer, a TFT is formed, and then a plastic substrate is bonded onto the TFT, and finally the glass substrate is peeled off by way of the heat insulating film, whereby a transfer of the TFT is completed. Because the heat insulating film is removed, abnormality caused by overheat at the time of operation is well prevented from occurring.

31 Claims, 27 Drawing Sheets

[1]

[2]

[3]

[1]

[2]

[1]

[2]

[3]

[1]

[2]

[3]

[1]

[2]

[1]

[2]

[1]

[2]

(A)　　　　　(B)

(1)

(2)

(A)                  (B)

[1]

[2]

(1)

(2)

[1]

[2]

(1)

(2)

(1)

(2)

[1]

[2]

[1]

[2]

[1]

[2]

(1)

(2)

(3)

(4)

MANUFACTURING METHOD OF THIN FILM DEVICE SUBSTRATE

BACKGROUND OF THE INVENTION

1. Field of the Invention

The present invention relates to a manufacturing method of a thin film device substrate which comprises the step of transferring a thin film device formed on one substrate onto another substrate.

2. Description of the Related Art

For the switching element in the pixel section of the liquid crystal display unit, the thin film transistor (referred to as the "TFT" hereinafter) has been being widely used. In recent years, with the object of achieving the liquid crystal display unit of higher precision as well as producing the system on glass (referred to as the "SOG" hereinafter) successfully, there have been growing demands for higher operation speeds. The SOG herein is a technique to integrate, along with the TFT for driving the liquid crystal, the TFTs in adjacent circuits such as the driver circuit, the memory and the CPU (Central Processing Unit) onto one glass substrate.

(First Conventional Technique)

As the typical method of forming a polycrystalline silicon film on a glass substrate, there can be given the laser annealing method. In the ordinary laser annealing method, after a silicon oxide film is formed as a buffer layer on a glass substrate and an amorphous silicon film is formed on this silicon oxide film, the amorphous silicon film made molten by laser irradiation is recrystallized to form a polycrystalline silicon film.

Meanwhile, the method of increasing the grain size of the crystal is under investigation, since the operation speed of the polycrystalline silicon TFT rises with increasing grain size thereof. For instance, as an attempt to make the grain size of the crystals larger through the use of annealing, there is a method of forming a porous silicon oxide film with a thermal conductivity lower than the ones of conventionally employed silicon oxide films as an underlying layer of the amorphous silicon film (Japanese Patent Application Laid-open No. 91604/2000). When the temperature of amorphous silicon film increases owing to the laser annealing, the thermal diffusion from the amorphous silicon film to the substrate takes place. The presence of the porous silicon oxide film which is set to underlie the amorphous silicon film reduces the thermal diffusion rate so that the melting time period for the amorphous silicon film hereat becomes longer than that in the ordinary laser annealing methods. As a result, a polycrystalline silicon film whose particle size is larger than the usual ones may be obtained.

(Second Conventional Technique)

Next, the substrate materials are described. For example, when the liquid crystal display device making use of the TFT is fabricated, a glass substrate is not necessarily the best material. The glass substrate is disadvantageously heavy, fragile and inflexible. As against this, as the substrate which is lighter, less fragile and more flexible, there can be given the plastic substrate. However, the TFT formed on the plastic substrate has the disadvantage of poorer performance than that of the TFT formed on the glass substrate, since the processing temperature for the TFT formed on the plastic substrate is limited to 150° C. or so. Accordingly, there have been brought forward several methods (referred to as the "substrate peeling-off methods" hereinafter) wherein, after a plastic substrate is bonded onto a TFT formed on a glass substrate, the glass substrate is peeled off therefrom and thereby the TFT is transferred onto the plastic substrate. They are further described below.

In a method disclosed in Patent Literature 2, by forming numerous trenches in a glass substrate and then forming a silicon oxide film on the glass substrate by means of spin-coat, formation of gaps in the trenches is made, and following the TFT formation, an etching solution is permeated into these gaps, and thereby the glass substrate is peeled off. In a method disclosed in Patent Literature 3, an isolation layer made of amorphous silicon or the like is laid on a glass substrate that can transmit a laser light, and thereon a TFT is formed. After another substrate is adhered onto this TFT, backside irradiation with the laser light is applied thereto, whereby the bonding force of the isolation layer is weakened so as to separate the glass substrate therefrom. In a method disclosed in Patent Literature 4, a glass substrate is characteristically removed by chemical polishing.

(First Problem)

As described in First Conventional Technique, a polycrystalline silicon film of large grain size can be attained by applying laser annealing onto an amorphous silicon film overlying a porous silicon oxide film. However, because the porous silicon oxide film hinders thermal diffusion, the TFT laid on the porous silicon oxide film tends to make abnormal operations when overheated. Furthermore, the porous silicon oxide film is fragile so that the overall mechanical strength of the whole TFT substrate becomes less than satisfactory.

(Second Problem)

For the substrate peeling-off methods described in Second Conventional Technique, the following problems are known. In the method of Japanese Patent Application Laid-open No. 288522/1996, the step of forming trenches in a glass substrate is comprised so that the glass substrate surface becomes rough, which lowers the pattern accuracy of the thin film device formed on the glass substrate. In the method of Japanese Patent Application Laid-open No. 26733/1999, because the peeling-off is made with a laser, a material such as a glass having a low transmittance for the laser light or a silicon impervious to laser light cannot be employed for the substrate. In the method of Japanese Patent Application Laid-open No. 212116/1999, the use of the polishing method lengthens its processing tome period.

Accordingly, an object of the present invention is to provide a method of manufacturing a thin film device substrate which can well prevent the thin film device formed by laser annealing from making, due to overheating, abnormal operations, and can provide the substrate peeling-off method wherein no trench fabrication is required to be applied onto the substrate surface, and a material which is impervious to light can be used, and besides the substrate can be peeled off in a short period of time.

SUMMARY OF THE INVENTION

A method of manufacturing a thin film device substrate (referred to as a "manufacturing method" hereinafter) comprising the steps of forming, on a first substrate, a heat insulating film to hinder heat conduction; forming a semiconductor film on said heat insulating film; applying laser annealing to said semiconductor film; forming a thin film device with said semiconductor film which has been subjected to the laser annealing; bonding a second substrate onto said thin film device; and peeling off said first substrate and said heat insulating film from a layered structure between said first substrate and said second substrate inclusive.

A "thin film device substrate" as used herein is a substrate in which a thin film device is formed. One or more layers of other films can be inserted between the first substrate and the heat insulating film, between the heat insulating film and the semiconductor film and between the semiconductor film and the second substrate, respectively.

On the first substrate, a heat insulating film is formed, and on the heat insulating film a semiconductor film is formed, and then laser annealing is applied onto the semiconductor film. The heat insulating film hereat holds the heat provided by the laser annealing and, thus, the semiconductor film is kept at high temperature for a long period of time. As a result, crystals of large particle size are formed in the semiconductor film. Subsequently, a thin film device is formed with this semiconductor film which has been subjected to the laser annealing. This semiconductor device has the advantage of high performance such as high carrier mobility. Nevertheless, with the conventional techniques, the heat insulating film is left lying thereunder so that the heat insulating film hinders diffusion of the heat the TFT operation generates. In short, the very heat insulating film that is useful at the time of laser annealing becomes the primary cause of the abnormal operation at the time of the thin film device operation. Therefore, in the present invention, the heat insulating film is removed after the second substrate is bonded onto the thin film device. As the first substrate is peeled off from the thin film device and the second substrate, the thin film device formed on the first substrate is, thus, transferred onto the second substrate. In this instance, because the heat insulating film is removed, abnormal operation of the thin film device caused by overheat thereof can be well suppressed. Further, in the case that this heat insulating film is fragile, mechanical strength of the film device substrate becomes also improved.

On the first substrate, a heat insulating film is formed, and on the heat insulating film a semiconductor film is formed, and then laser annealing is applied onto the semiconductor film. The heat insulating film hereat holds the heat provided by the laser annealing and, thus, the semiconductor film is kept at high temperature for a long period of time. As a result, crystals of large particle size are formed in the semiconductor film. Subsequently, a thin film device is formed with this semiconductor film which has been subjected to the laser annealing. This semiconductor device has the advantage of high performance such as high carrier mobility. Nevertheless, with the conventional techniques, the heat insulating film is left lying thereunder so that the heat insulating film hinders diffusion of the heat the TFT operation generates. In short, the very heat insulating film that is useful at the time of laser annealing becomes the primary cause of the abnormal operation at the time of the thin film device operation. Therefore, in the present invention, the heat insulating film is removed after the second substrate is bonded onto the thin film device. As the first substrate is peeled off from the thin film device and the second substrate, the thin film device formed on the first substrate is, thus, transferred onto the second substrate. In this instance, because the heat insulating film is removed, abnormal operation of the thin film device caused by overheat thereof can be well suppressed. Further, in the case that this heat insulating film is fragile, mechanical strength of the film device substrate becomes also improved.

A manufacturing method comprising the steps of forming, on a first substrate, a heat insulating film to hinder heat conduction; forming a semiconductor film on said heat insulating film; applying laser annealing to said semiconductor film; bonding a second substrate onto said semiconductor film which has been subjected to the laser annealing; peeling off said first substrate and said heat insulating film from a layered structure between said first substrate and said second substrate inclusive; and forming a thin film device with said semiconductor film which has been subjected to the laser annealing.

In the above-described manufacturing method, wherein the heat insulating film is a film having a gap space. Since the gap space does not conduct heat much, the heat insulating film having a very low effective thermal conductivity may be obtained.

In the above-described manufacturing method, wherein the film having a gap space is a porous film. As the porous film has numerous minute gap spaces, its effective thermal conductivity becomes very low.

In the above-described manufacturing method, wherein the gap space is formed by means of etching. Etching can easily provide a comparatively large gap space.

In the above-described manufacturing method, wherein the step of forming a heat insulating film on a first substrate comprising the steps of forming, on the first substrate, a primary film in which the gap space is to be formed in a subsequent step; forming, in a film formed on the primary film, a large number of through holes to reach the primary film; and supplying a etchant from the through holes and thereby forming the gap space in the primary film. The "etchant" as used herein is a generic name for etching solutions, etching gases and the likes. On the substrate, a primary film is formed and then on the primary film, a semiconductor film, for example, is formed. Next, in the semiconductor film, a large number of through holes are formed so as to reach the primary film. Being supplied from these through holes, an etchant etches the primary film isotropically, whereby gap spaces are formed even under the semiconductor film. In this way, the primary film is made a heat insulating film.

In the above-described manufacturing method, wherein the step of peeling off the first substrate and the heat insulating film comprising the step of supplying the etchant into the gap space and thereby removing the heat insulating film. The heat insulating film is removed after the second substrate is bonded onto the thin film device. The removal of the heat insulating film hereat is made by supplying the etchant into the gap space which has been formed in the preceding step. Because numerous gap spaces have been already formed in this heat insulating film, the surface area of the heat insulating film which comes into contact with the etchant has become considerably large so that the heat insulating film can be readily removed.

In the above-described manufacturing method, wherein the step of peeling off the first substrate and the heat insulating film comprising the step of breaking the heat insulating film mechanically. Available breaking methods include a method wherein a wedge-like thing is driven into the heat insulating film to peel off the first substrate and the heat insulating film from the layered structure, and a method wherein the first substrate and the second substrate are made rotate in opposite directions with the heat insulating film being taken as the surface of revolution. Further, after only part of the heat insulating film is etched, the heat insulating film left by that etching can be removed by means of breaking. It is also possible to break part of the heat insulating film first and etch away the rest of the heat insulating film.

In the above-described manufacturing method, wherein the heat insulating film is made of silicon oxide. Silicon oxide can be easily made porous by the spin coating method or the anodization method. Moreover, with excellent heat resistance, silicon oxide can readily stand laser annealing.

In the above-described manufacturing method, which further comprising the step of forming, over the heat insulating film, a peeling-off film that is to be peeled off in a subsequent step; wherein the step of peeling off the first substrate and the heat insulating film comprising the step of removing the peeling-off film. One or more layers of other films can be inserted between the heat insulating film and the peeling-off film. A peeling-off film is formed over the heat-insulating film beforehand, and after a second substrate is bonded onto the thin film device, this peeling-off film is removed. Together with the peeling-off film, the first substrate and the heat insulating film are hereupon removed.

In the above-described manufacturing method, which further comprising the step of forming, under the heat insulating film, a peeling-off film that is to be peeled off in a subsequent step; wherein the step of peeling off the first substrate and the heat insulating film comprising the step of removing the peeling-off film and removing the heat-insulating film. One or more layers of other films can be inserted between the peeling-off film and the heat insulating film. A peeling-off film is formed under the heat-insulating film beforehand, and after a second substrate is bonded onto the thin film device, this peeling-off film is removed. Together with the peeling-off film, the first substrate is hereupon removed. The remaining heat insulating film is removed separately. Further, the step of removing a peeling-off film and the step of removing a heat insulating film can be made one and the same step so that the peeling-off film and the heat insulating film may be removed simultaneously.

In the above-described manufacturing method, wherein the heat insulating film is made of a film having a gap space; and the step of removing the peeling-off film comprising the step of making an etchant permeate through the gap space and thereby etching the peeling-off film. The etchant permeates rapidly through the gap spaces of the heat insulating film and removes the peeling-off film lying over or under the heat insulating film. This shortens the period of time necessary to remove the first substrate.

In the above-described manufacturing method, wherein the peeling-off film is made of chromium and the heat insulating film is made of porous silicon oxide. As chromium and silicon oxide excels in heat resistance, they can readily stand laser annealing. Furthermore, chromium etchant permeates rapidly through minute gap spaces of porous silicon oxide and removes the chromium film lying over or under the porous silicon oxide film. This shortens the period of time necessary to remove the first substrate.

In the above-described manufacturing method, wherein the step of peeling off the first substrate and the heat insulating film comprising the step of breaking mechanically, at least, one of the heat insulating film and the peeling-off film. As for the actual breaking method, the aforementioned methods also apply hereto.

In the above-described manufacturing method, wherein the step of peeling off the first substrate and the heat insulating film comprising the step of dividing the layered structure into a plural number prior to the peeling-off. When peeling-off is chemically made with an etchant or such, the time period required for peeling off depends on the time for the etchant to penetrate, seen from above, from the periphery of the layered structure to the vicinity of its center. Further, when peeling-off is mechanically made with breaking or such, the time period required for peeling off depends on the time for a crack to develop, seen from above, from the periphery of the layered structure to the vicinity of its center. Consequently, division of the layered structure into a plural number reduces the length of the time required for the peeling-off, since the distance from the periphery to the center in each divided layered structure clearly becomes shorter. Meanwhile, breaking can be carried out, for example, by a method in which a wedge is driven into a gap space. There can be also utilized a combined method of these breaking methods, for instance, peeling-off is partly carried out by etching and then completed thoroughly by breaking.

In the above-described manufacturing method, wherein the semiconductor film is made of silicon. Silicon is a semiconductor particularly well suited for various thin film devices such as TFTs, photosensors and solar cells.

In the above-described manufacturing method, wherein the thin film device is a TFT. The semiconductor film is formed into a polycrystalline film of large grain size, which enables the TFT to operate at high speed.

In effect, the present inventors found out that the aforementioned first problem can be solved if, after forming a TFT in which a polycrystalline film of large grain size obtained through the use of a low-thermal-conductivity film is used as an active layer, this TFT is transferred onto another substrate and the low-thermal-conductivity film is removed, and, thus, reached the present invention. Further, the present inventors found out that the aforementioned second problem can be overcome by the substrate transfer method, wherein, after a structure with a gap space, for instance, a porous silicon oxide film is formed on a substrate and a TFT is formed on that substrate and another substrate is bonded onto that substrate, the structure with a gap space or an overlying layer or an underlying layer of that structure with a gap space is peeled off either by making an etchant penetrate thereto or by breaking mechanically, and, thus, reached the present invention. Moreover, both of the above requirements, that is, a low-thermal-conductivity film and a structure with a gap space can be met by one and the same film such as a porous silicon oxide film and, in this way, the first problem and the second problem can be solved simultaneously.

In a manufacturing method according to the present invention, after a heat-insulating film and a semiconductor film are successively formed on a first substrate, and laser annealing is applied onto this semiconductor film, and then a second substrate is bonded onto the semiconductor film, the first substrate and the heat-insulating film are peeled off from a layered structure of these films, whereby the heat insulating film is removed altogether so that abnormal operations caused by overheat of the thin film device can be well prevented. Further, even in the case that the heat insulating film is fragile, as the heat insulating film is removed, mechanical strength of the thin film device substrate can be certainly improved.

Further, when, on a substrate, a primary film is formed and, on the primary film, for example, a semiconductor film is formed and, then, in the semiconductor film, a large number of through holes are formed so as to reach the primary film, and an etchant is supplied from these through holes, a gap space can be formed even under the semiconductor film, and a heat insulating film with an extremely low thermal conductivity can be provided. In this case, if an etchant is supplied for a gap space to remove the heat insulating film in the step of peeling off a first substrate, the surface area of the heat insulating film which comes into contact with the etchant is so large that the first substrate and the heat insulating film can be peeled off with considerable ease. Therefore, no trench fabrication is required to be applied onto the first substrate surface, and a first substrate made of a material which is impervious to light can be used, and besides the first substrate can be peeled off in a short period of time.

Further, when a peeling-off film is formed over or under the heat-insulating film and peeling-off of the first substrate is made by removing this peeling-off film, no trench fabrication is required to be applied onto the substrate surface, and a material which is impervious to light can be used, and besides the substrate can be peeled off in a short period of time. In this instance, the use of a film having gap spaces as the heat insulating film and accomplishment of rapid penetration of the etchant through the gap spaces can shorten the period of time necessary to remove the peeling-off film.

Further, if the layered structure between the first substrate and the second substrate is divided into a plural number before the first substrate is peeled off, the distance from the periphery to the center, seen from above, in each divided layered structure becomes shorter so that the time period necessary to peel off can be reduced.

In other words, in a TFT wherein a polycrystalline film of large grain size obtained through the use of a low-thermal-conductivity film is used as an active layer, the present invention can raise the diffusion rate for the heat generated at the time of operation to transfer from the TFT to the substrate. Further, the problems in the substrate transfer method that the glass substrate surface becomes rough and that a glass substrate impervious to the laser light cannot be used as a substrate can be readily overcome.

DETAILED DESCRIPTION OF THE INVENTION AND PREFERRED EMBODIMENTS

Figure 1:
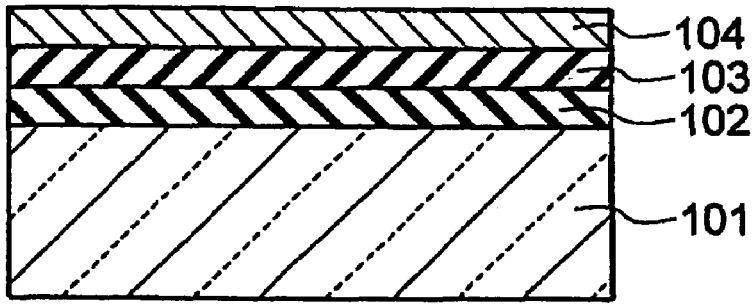
FIG. 1 is a series of schematic cross-sectional views (the first part) illustrating one embodiment of the present invention and the steps of a manufacturing method thereof proceed in the order of FIG. 1(1) to FIG. 1(3).
Figure 1:
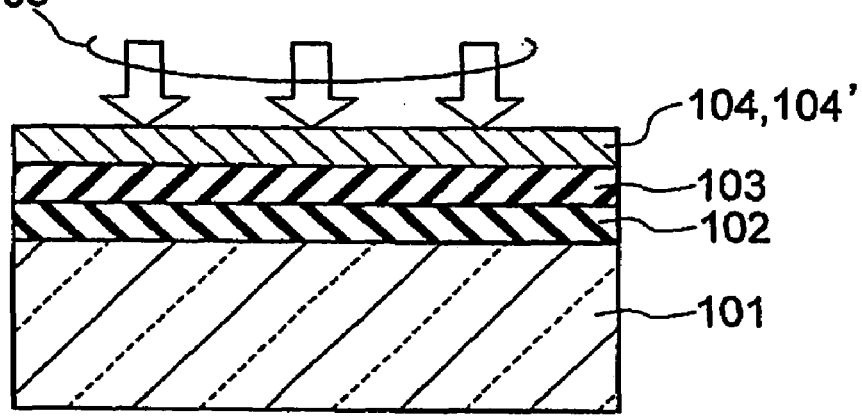
Figure 1:
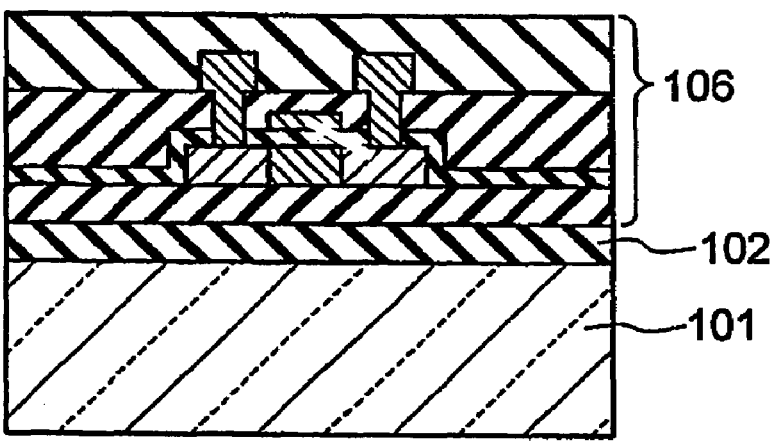
Figure 2:
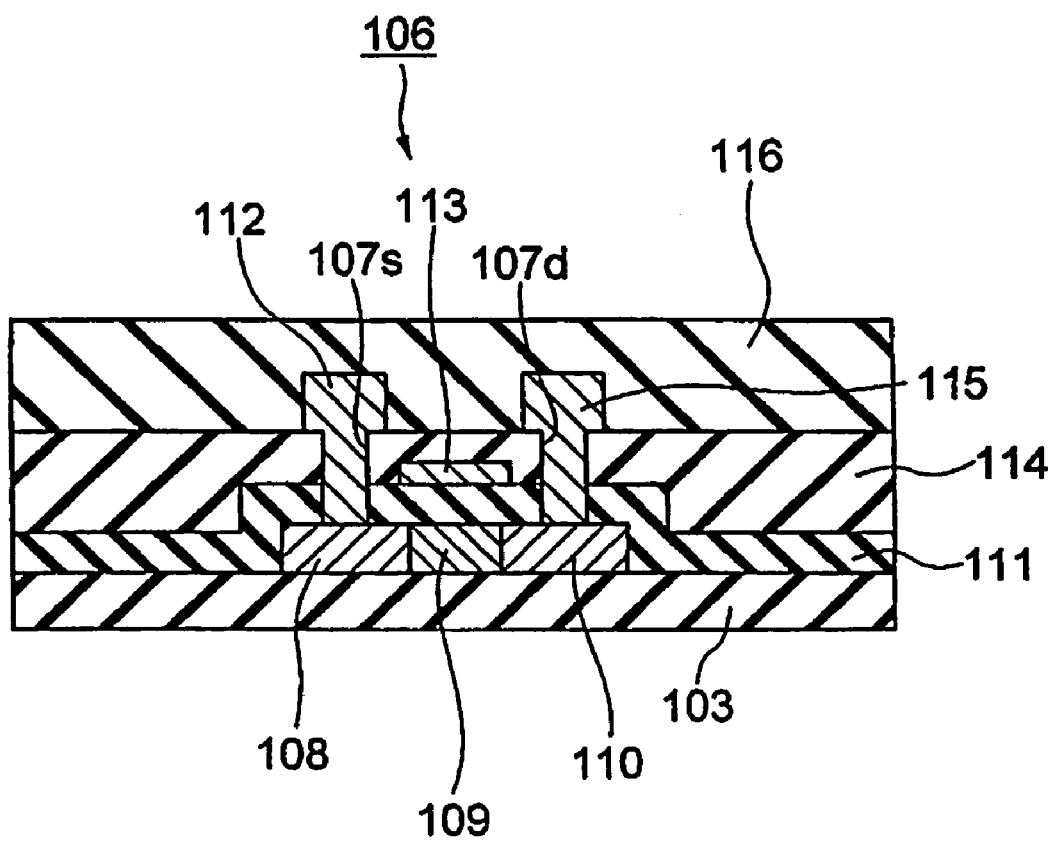
FIG. 2 is a schematic cross-sectional view showing an enlarged view of the TFT of FIG. 1(3).
Figure 3:
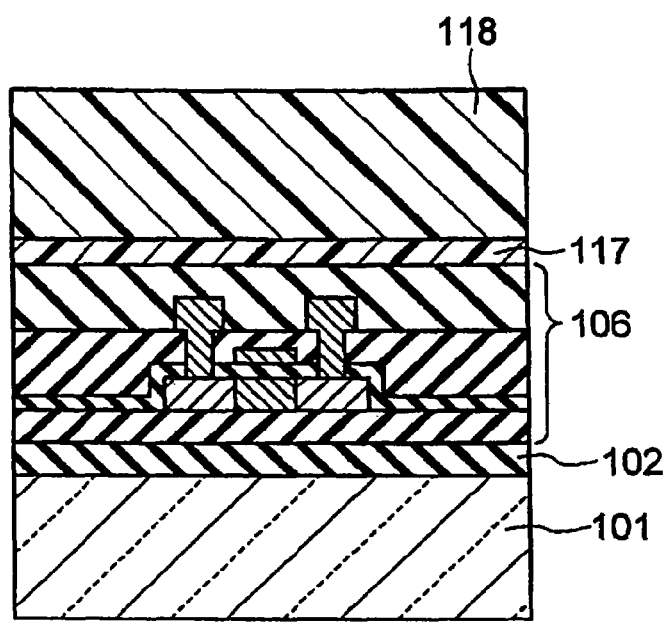
FIG. 3 is a series of schematic cross-sectional views (the second part) illustrating one embodiment of the present invention and the steps of the manufacturing method thereof proceed in the order of FIG. 3(1) to FIG. 3(2).
Figure 3:
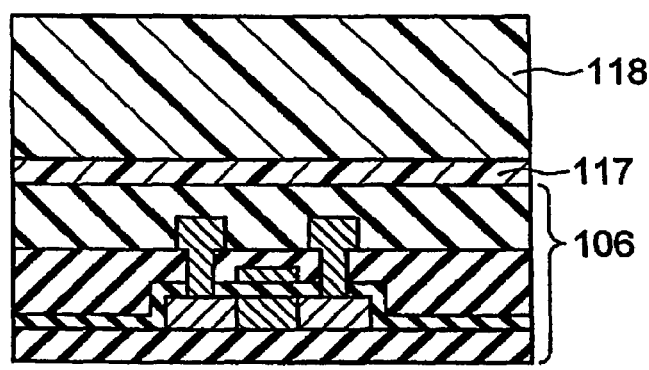
Figure 3:
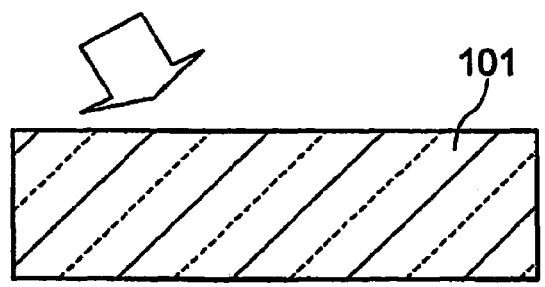

FIGS. 1-3 are a series of schematic cross-sectional views illustrating one embodiment of the present invention. The steps of a manufacturing method thereof proceed in the order of FIG. 1(1), FIG. 1(2), FIG. 1(3), FIG. 3(1) and FIG. 3(2). Referring to these drawings, the embodiment of the present invention is described below. The terms "first substrate", "semiconductor film", "thin film device" and "second substrate" are herein replaced, being embodied, with "glass substrate", "amorphous silicon film", "TFT" and "plastic substrate", respectively.

Firstly, as shown in FIG. 1(1), on a glass substrate 101 having a flat surface, a heat insulating film 102, a silicon oxide film 103 and an amorphous silicon film 104 are formed in succession. The value of the thermal conductivity of the thin film varies with not only the type of its material but also the structural closeness of the substance therein. Therefore, it is possible to form the heat insulating film 102 by using a material having a lower thermal conductivity than, for example, silicon oxide by making its film structure to have gap spaces, without using a low-thermal-conductivity film or such. The film structure having gap spaces may be readily obtained if an amorphous silicon oxide film formed by the spin coating method is utilized. Otherwise, there can be employed a silicon oxide film in which gap spaces are formed by selective etching.

Following that, as shown in FIG. 1(2), the amorphous silicon film 104 is irradiated from above with a laser beam 105 of an excimer laser. This melts the amorphous silicon film 104, which then undergoes recrystallization to form a polycrystalline silicon film 104'. On this occasion, because the heat insulating film 102 hinders thermal diffusion occurring from the molten amorphous silicon film 104 to the glass substrate 101, the melting time of the amorphous silicon film 104 becomes longer than that in the absence of the heat insulating film 102. As a result, the grain size of crystals in the polycrystalline silicon film 104 becomes greater.

Subsequently, as shown in FIG. 1(3), with this polycrystalline silicon film 104' of large grain size being used as an active layer, a TFT 106 is formed. Hereat, as shown in detail in FIG. 2, after a gate insulating film 111 is first formed on the polycrystalline silicon film of large grain size, and channel doping into a channel region 109 is performed, a gate electrode 113 is formed on a gate insulating film 111. Next, after dopants are doped into a source region 108 and a drain region 110, a first interlayer insulating film 114 is formed so as to cover the gate electrode 113 as well as the gate insulating film 111, and contact holes 107s and 107d which run through the first interlayer insulating film 114 and the gate insulating film 111 are formed. Next, a source electrode 112 and a drain electrode 115 which are connected with the source region 108 and the drain region 110 through the contact holes 107s and 107d, respectively, are formed on the fist interlayer insulating film 114. After that, a second interlayer insulating film 116 is formed so as to cover the source electrode 112 and the drain electrode 115, and thereby formation of the TFT 106 is accomplished.

Subsequently, as shown in FIG. 3(1), a plastic substrate 118 is bonded onto the TFT 106 by way of an adhesion layer 117. Finally, as shown in FIG. 3(2), the heat insulating film 102 is removed and the glass substrate 101 is peeled off, and thereby the transfer of the TFT 106 is completed.

Hereat, the substrate peeled off at the end (referred to as the "peeling-off substrate" hereinafter) is not necessarily required to be a glass substrate 101, and a plastic substrate, a metal substrate or a layered substrate made of two or more layers of these can be used. The laser for use need not be an excimer laser and can be a solid laser such as a YAG laser or a YLF laser, or a gas laser such as a carbon dioxide gas laser or an argon gas laser. The substrate to which the TFT 106 is transferred (referred to as the "transfer substrate" hereinafter) is not necessarily required to be a plastic substrate 118, and a glass substrate, a metal substrate or a layered substrate made of two or more layers of these can be utilized. In view of the operation of the TFT 106, the thermal conductivity of the transfer substrate is preferably about the same as or greater than the thermal conductivity of silicon oxide. As regarding the formation of the heat insulating film 102, it is preferable to make use of the structure with gap spaces, since this enables methods of peeling off the plastic substrate 118 by permeating an etchant into the gap spaces therein or by making mechanical break to be employed. The etchant to be permeated can etch the film having the gap spaces itself or etch another film adjacent to the film having the gap spaces. It is not necessarily required that the film structure with gap spaces is formed prior to the fabrication of the TFT 106, and they may be formed while or after the TFT 106 is fabricated. Furthermore, in reality, even the transfer of the TFT 106 need not be made after the TFT formation, and it is possible that the polycrystalline silicon film 104' is transferred immediately after the laser annealing, and, thereafter, the formation of the TFT 106 is made.

With the conventional techniques, a polycrystalline silicon whose particle size is larger than that of an ordinary amorphous silicon film laid on silicon oxide can be attained by forming a porous silicon oxide film under the amorphous silicon oxide film. However, because the amorphous silicon oxide film is left lying thereunder, the rate that the heat generated at the time of the TFT operation is transferred to the substrate is rather small. Furthermore, the conventional technique has the disadvantage of low mechanical strength of the substrate. As against this, in the present embodiment, because the heat insulating film 102 is removed at the time of the TFT 106 transfer, such a problem as described above does not occur.

In effect, the present embodiment is characterized by a point that the heat insulating film 102 used to form a polycrystalline silicon film 104' of large grain size in the step of performing excimer laser annealing is removed by a transfer after the TFT 106 formation. Further, the present embodiment is not limited to a method of manufacturing a TFT 106 and the area of its application include other thin film devices such as a solar cell. In addition, the conventional techniques have, as described in "Problem to be Solved by the Invention", other problems such as that the surface of the glass substrate is liable to become rough, and that a glass impervious to the laser light cannot be employed for the substrate. In contrast with this, the present invention can overcome the above problems, for example, by forming a film with gap spaces by the spin coating method or such.

Next, examples of the present embodiment are further described in detail below.

FIRST EXAMPLE

Figure 4:
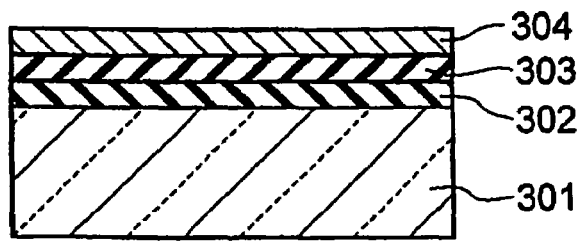
FIG. 4 is a series of schematic cross-sectional views (the first part) illustrating Example 1 of the present invention and the steps of a manufacturing method thereof proceed in the order of FIG. 4(1) to FIG. 4(4).
Figure 4:
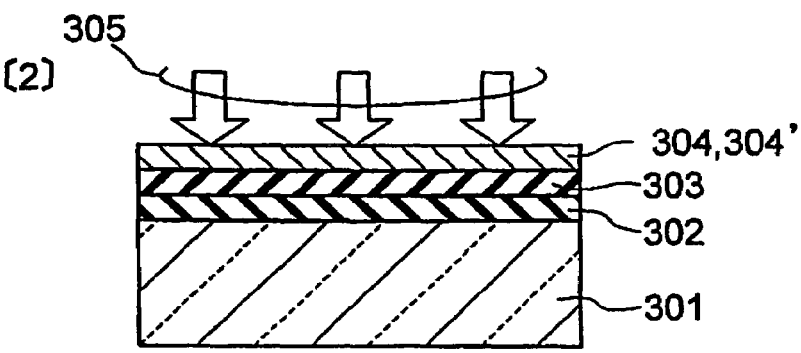
Figure 4:
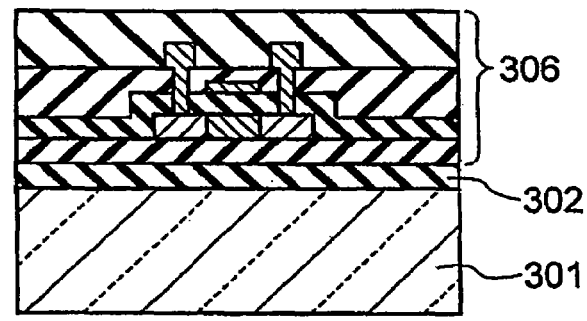
Figure 4:
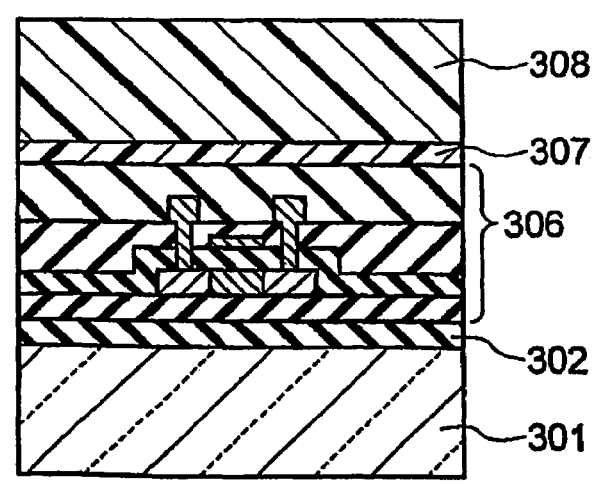
Figure 5:
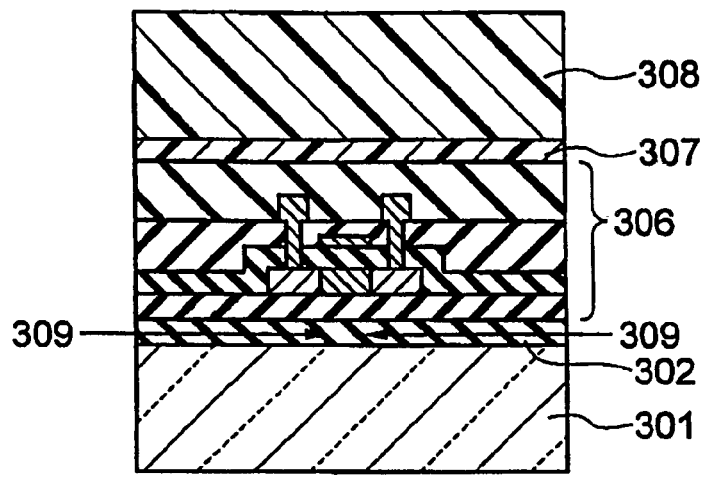
FIG. 5 is a series of schematic cross-sectional views (the second part) illustrating Example 1 of the present invention and the steps of the manufacturing method thereof proceed in the order of FIG. 5(1) to FIG. 5(3).
Figure 5:
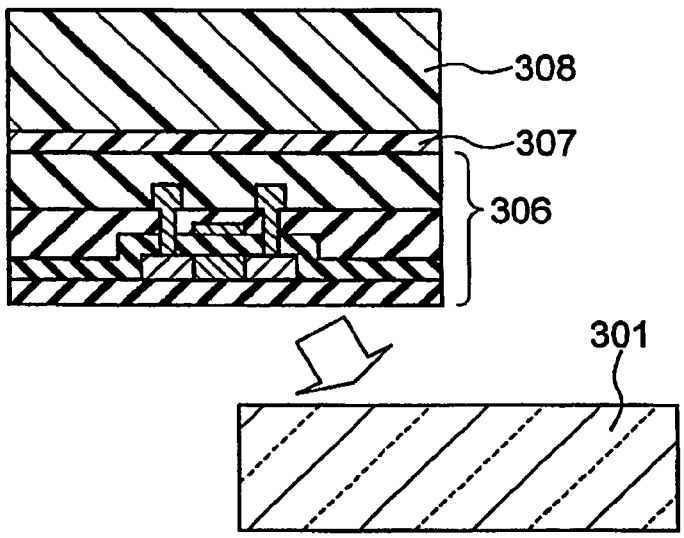
Figure 5:
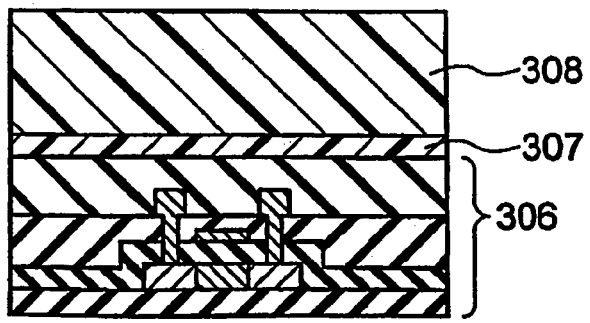

FIGS. 4 and 5 are a series of schematic cross-sectional views illustrating Example 1 of the present invention. The steps of a manufacturing method thereof proceed in the order of FIG. 4(1), FIG. 4(2), FIG. 4(3), FIG. 4(4), FIG. 5(1), FIG. 5(2) and FIG. 5(3). Referring to these drawings, the embodiment of the present invention is described below.

Firstly, as shown in FIG. 4(1), on a glass substrate 301, a porous silicon oxide film 302 is formed by the spin coating method as a heat insulating film, and on the porous silicon oxide film 302 a silicon oxide film 303 is formed, and then an amorphous silicon oxide film 304 is formed by the LPCVD (Low Pressure Chemical Vapor Deposition) method. A liquid used in this spin coating method is, for example, a solution of silanol-based monomers or oligomers dissolved in an organic solvent such as alcohol or ketone or a solution in which fine powders of silicon oxide are dispersed and suspended in an organic solvent. By dropping the liquid onto the glass substrate 301, making its application for coating uniform with a spinner and then heating up to a temperature, for instance, 200° C. to 300° C., the porous silicon oxide film 302 can be formed.

Following that, as shown in FIG. 4(2), the amorphous silicon film 304 is irradiated from above with a laser beam 305 of an excimer laser to obtain a polycrystalline silicon film 304' of large grain size. Subsequently, as shown in FIG. 4(3), with this polycrystalline silicon film 304' being used as an active layer, a TFT 306 is formed. As the method of forming the TFT 306, a conventional method of forming on a glass substrate at a low temperature may be used. The structure of the TFT 306 is the same as shown in FIG. 2. After that, as show in FIG. 4(4), a plastic substrate 308 is bonded onto the top of the TFT 306 by way of an adhesion layer 307.

Next, as shown in FIG. 5(1), a layered structure between the glass substrate 301 and the plastic substrate 308 is immersed into hydrofluoric acid 309. When, seen from above, hydrofluoric acid 309 penetrates to the porous silicon oxide film 302 lying over the center of the glass substrate 301, selective etching of the porous silicon oxide film 302 becomes possible to be conducted, because the etching rate of the porous silicon oxide is greater than that of silicon oxide. Consequently, as shown in FIG. 5(2), the glass substrate 301 is peeled off. Now, as shown in FIG. 5(3), the transfer of the TFT 306 is completed.

With respect to the transfer substrate, it is not necessary to be a plastic substrate 308, and a glass substrate, a metal substrate or a layered substrate of two or more of these can be utilized. The thermal conductivity of the transfer substrate is preferably not less than that of silicon oxide.

SECOND EXAMPLE

Figure 6:
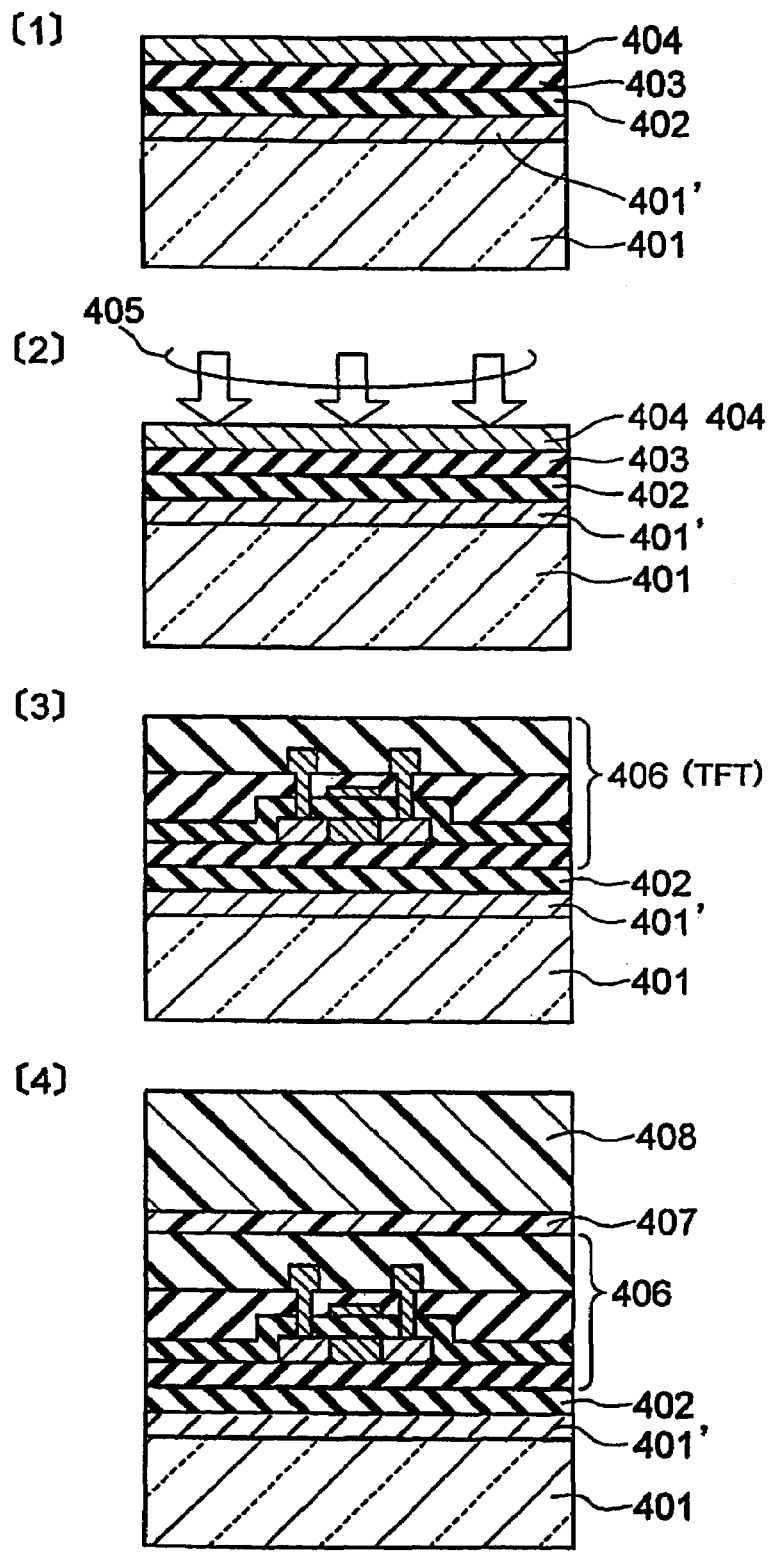
FIG. 6 is a series of schematic cross-sectional views (the first part) illustrating Example 2 of the present invention and the steps of a manufacturing method thereof proceed in the order of FIG. 6(1) to FIG. 6(4).
Figure 7:
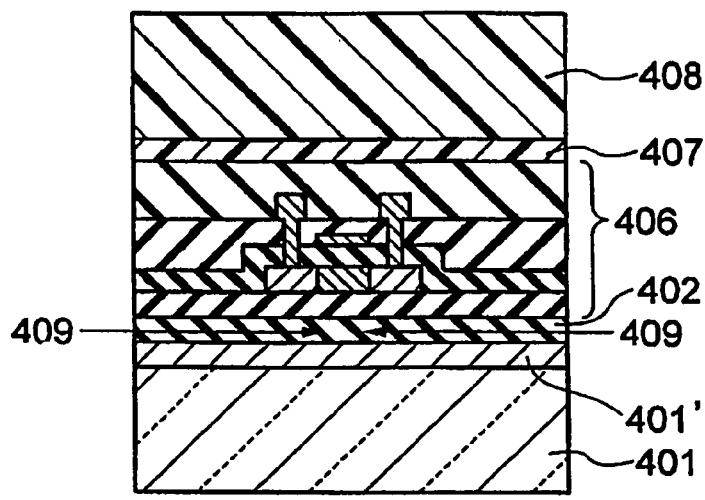
FIG. 7 is a series of schematic cross-sectional views (the second part) illustrating Example 2 of the present invention and the steps of the manufacturing method thereof proceed in the order of FIG. 7(1) to FIG. 7(3).
Figure 7:
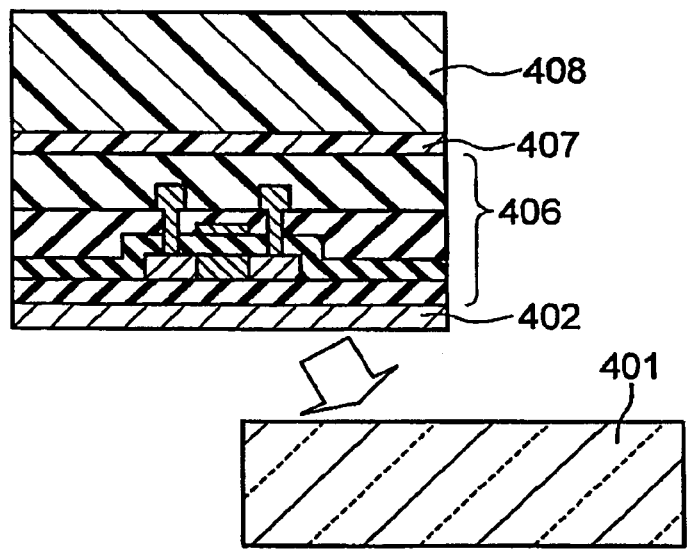
Figure 7:
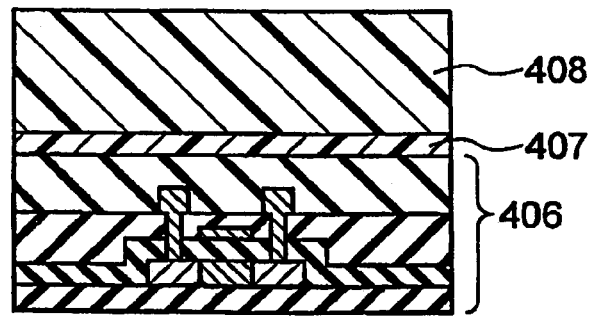

FIGS. 6 and 7 are a series of schematic cross-sectional views illustrating Example 2 of the present invention. The steps of a manufacturing method thereof proceed in the order of FIG. 6(1), FIG. 6(2), FIG. 6(3), FIG. 6(4), FIG. 7(1), FIG. 7(2) and FIG. 7(3). Referring to these drawings, the embodiment of the present invention is described below.

As shown in FIG. 6(1), on a glass substrate 401, a chromium film 401' is first formed as a peeling-off film, for example, by the sputtering method, and on the chromium film 401' a porous silicon oxide film 402 is formed as a heat insulating film by the spin coating method, and, then, on the porous silicon oxide film 402 a silicon oxide film 403 is formed by the plasma CVD method, and thereon an amorphous silicon film 404 is further formed by the thermal CVD method. Following that, as shown in FIG. 6(2), the amorphous silicon film 404 is irradiated from above with a laser beam 405 of an excimer laser to obtain a polycrystalline silicon film 404'. Since the presence of the porous silicon oxide film 402 inhibits heat conduction from the amorphous silicon film 404 whose temperature is raised by the laser annealing, the recrystallizing time becomes longer than that in the conventional methods wherein no amorphous silicon oxide film 402 is used and, therefore, silicon crystals with larger grain size can be attained. Subsequently, as shown in FIG. 6(3), with this polycrystalline silicon film 404' being used as an active layer, a TFT 406 is formed. As the method of forming the TFT 406, a conventional method of forming a TFT on a glass substrate at a low temperature may be used. The structure of the TFT 346 is the same as shown in FIG. 2. After that, as show in FIG. 6(4), a plastic substrate 408 is bonded onto the TFT 406 by way of an adhesion layer 407.

Next, as shown in FIG. 7(1), a layered structure between the glass substrate 401 and the plastic substrate 408 is immersed into chromium etchant 409. When, seen from above, the chromium etchant 409 penetrates to the porous silicon oxide film 402 lying over the center of the glass substrate 401, the chromium etchant 409 permeates the whole interface between the porous silicon oxide film 402 and the chromium film 401'. Consequently, as shown in FIG. 7(2), the glass substrate 401 is peeled off by way of the chromium film 401'. Finally, the porous silicon oxide film 402 is removed by means of etching or such, and thereby, as shown in FIG. 7(3), the transfer of the TFT 406 is completed.

For the material to form a peeling-off film like the chromium film 401', any one of metals, semiconductors and insulators other than chromium can be used as a substitute, but a material with a low thermal conductivity is preferably used so that a crystalline silicon film of large grain size may be obtained. Further, the chromium film 401' may be formed either over or under the porous silicon oxide film 402.

THIRD EXAMPLE

FIGS. 8-17 are sets of schematic views illustrating Example 3 of the present invention, each set showing a plan view and one or two cross-sectional views. The steps of a manufacturing method thereof proceeds in the order of FIG. 8, FIG. 9, FIG. 10, FIG. 11, FIG. 12, FIG. 13, FIG. 14, FIG. 15, FIG. 16 and FIG. 17. Referring to these drawings, the embodiment of the present invention is described below.

Figure 8:
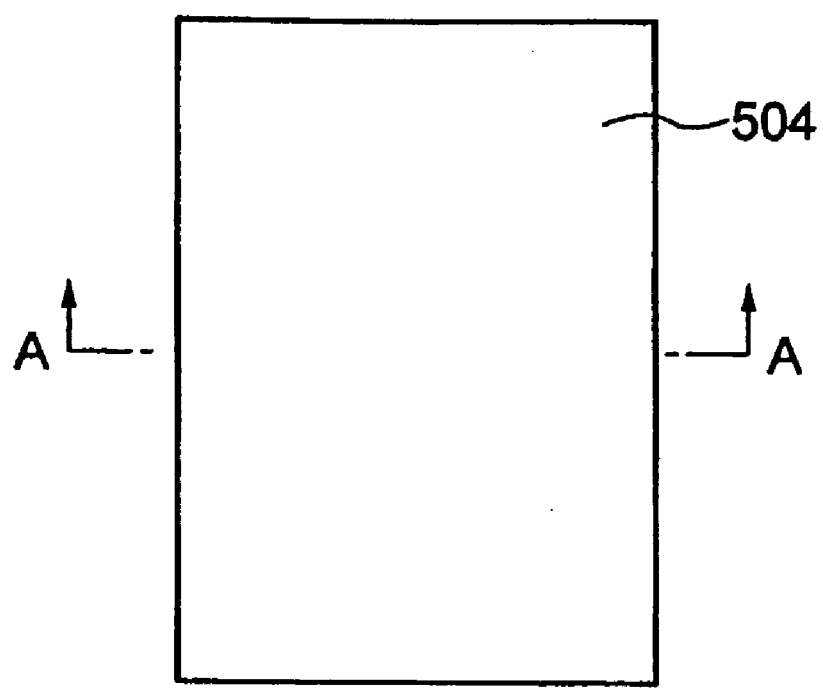
FIG. 8 is a pair of schematic views illustrating Example 3 of the present invention (the first part), in which a plan view thereof is shown in FIG. 8(1) and a portion of a vertical sectional view taken on line A-A of FIG. 8(1), in FIG. 8(2).
Figure 8:
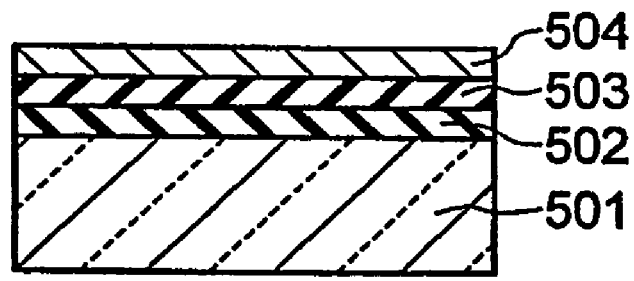

Firstly, as shown in FIG. 8, on a glass substrate 501, a silicon oxide film 502, a silicon nitride film 503 and an amorphous silicon oxide film 504 are successively formed in this order. The silicon nitride film 503 is formed by the PECVD (Plasma-Enhanced CVD) method. In this instance, hydrogen is fed into the CV chamber as a source gas, whereby a silicon nitride film containing a considerable amount of hydrogen is formed. In this way, the etching rate of silicon nitride by hydrofluoric acid can be made very small in comparison with that of silicon oxide.

Figure 9:
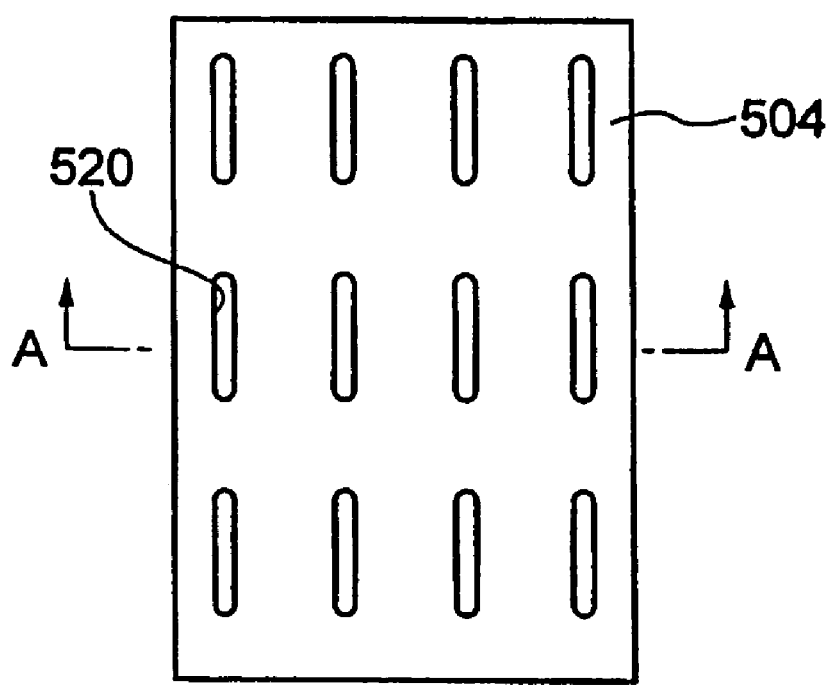
FIG. 9 is a pair of schematic views illustrating Example 3 of the present invention (the second part), in which a plan view thereof is shown in FIG. 9(1) and a portion of a vertical sectional view taken on line A-A of FIG. 9(1), in FIG. 9(2).
Figure 9:
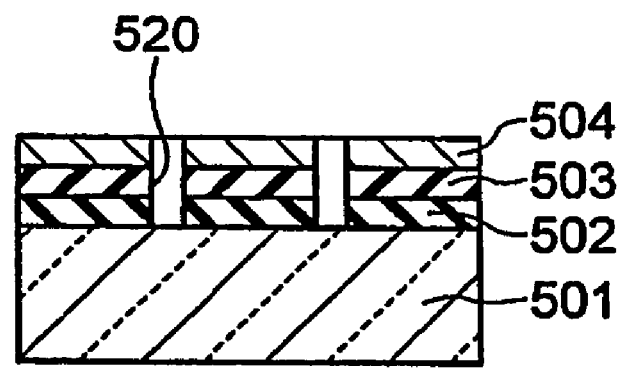

Next, as shown in FIG. 9, a photoresist film (not shown in the drawings) having a pattern with numerous long holes is formed by photolithography, and the silicon oxide film 502, the silicon nitride film 503 and the amorphous silicon film 504 are etched by means of dry etching down to the glass substrate 501, whereby numerous etchant supply holes 520 are formed to reach the glass substrate 501.

Figure 10:
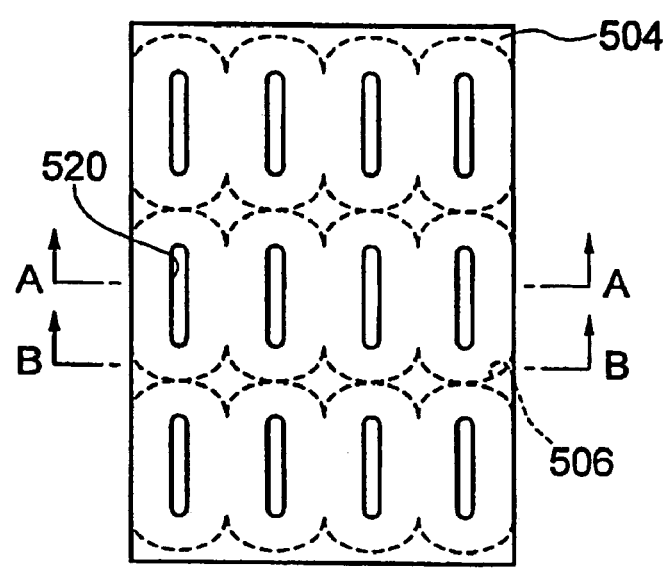
FIG. 10 is a set of schematic views illustrating Example 3 of the present invention (the third part), in which a plan view thereof is shown in FIG. 10(1), a portion of a vertical sectional view taken on line A-A of FIG. 10(1), in FIG. 10(2)(A) and a portion of a vertical sectional view taken on line B-B of FIG. 10(1), in FIG. 10(2)(B).
Figure 10:
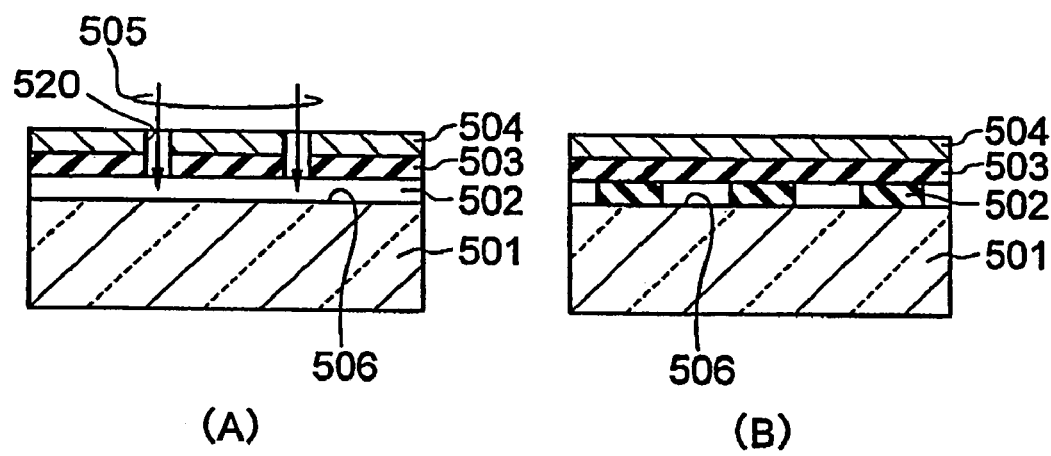

Subsequently, as shown in FIG. 10, the glass substrate 501 wherein the etchant supply holes 520 have been formed is immersed into hydrofluoric acid 505. Since the etching rate of the silicon nitride film 503 is lower than those of the silicon oxide film 502 and the glass substrate 501, etched regions in the silicon oxide film 502 expand elliptically, centering around respective etchant supply holes 520, and gap spaces 506 are formed, which results in a structure wherein the flat silicon nitride film 503 and amorphous silicon film 504 overlie the silicon oxide film 502 remaining in the form of pillars.

Figure 11:
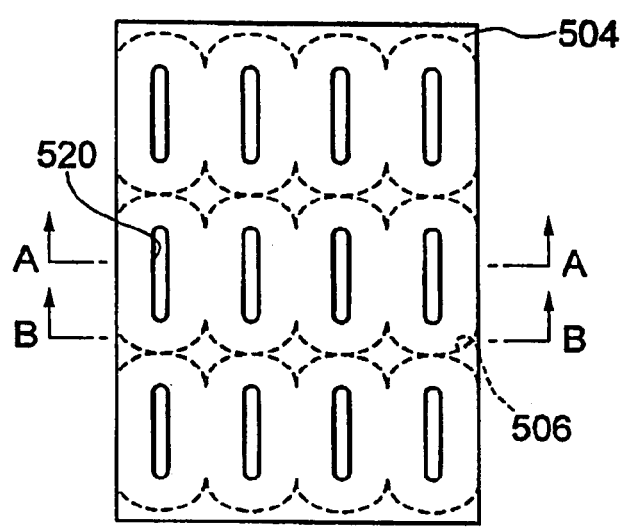
FIG. 11 is a set of schematic views illustrating Example 3 of the present invention (the fourth part), in which a plan view thereof is shown in FIG. 11 (1), a portion of a vertical sectional view taken on line A-A of FIG. 11(1), in FIG. 11(2)(A) and a portion of a vertical sectional view taken on line B-B of FIG. 11(1), in FIG. 11(2)(B).
Figure 11:
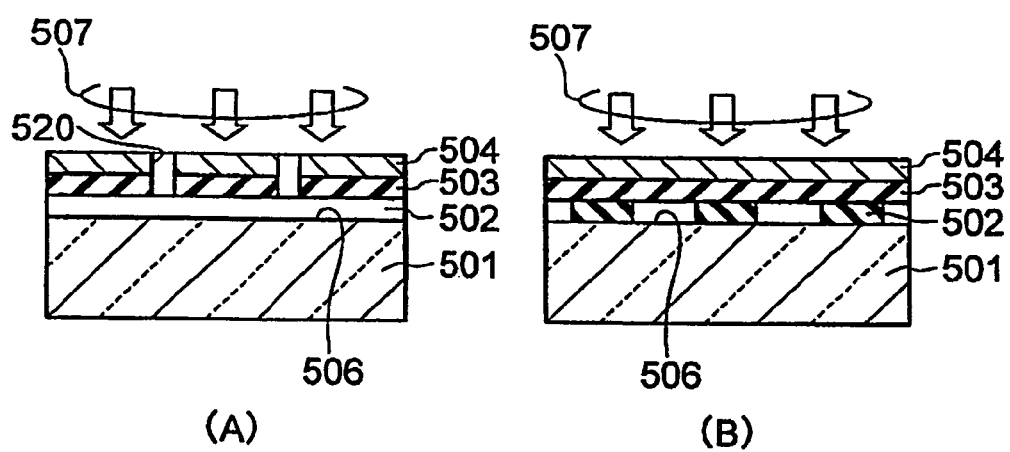
Figure 12:
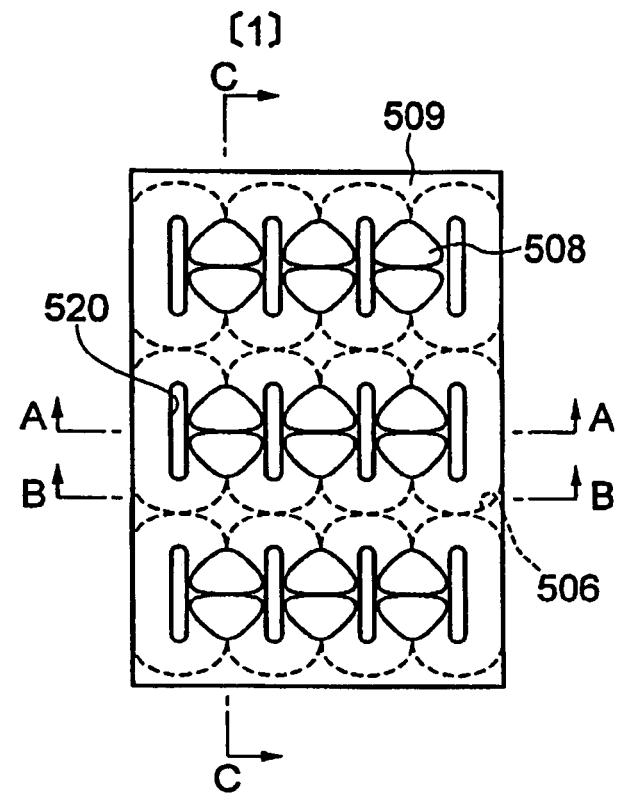
FIG. 12 is a set of schematic views illustrating Example 3 of the present invention (the fifth part), in which a plan view thereof is shown in FIG. 12(1), a portion of a vertical sectional view taken on line A-A of FIG. 12(1), in FIG. 12(2)(A), a portion of a vertical sectional view taken on line B-B of FIG. 12(1), in FIG. 12(2)(B) and a vertical sectional view taken on line C-C of FIG. 12(1), in FIG. 12(2)(C).
Figure 12:
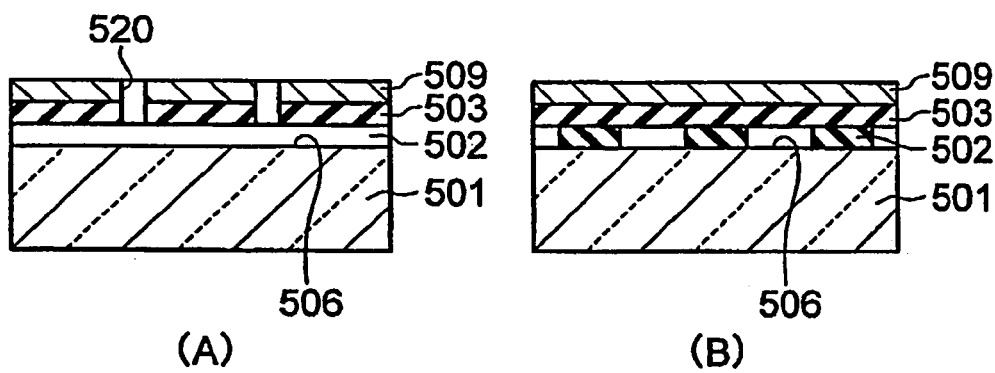
Figure 12:
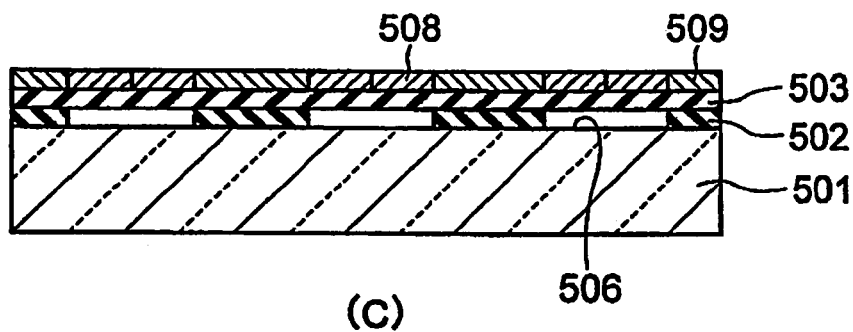

Following that, as shown in FIG. 11, the amorphous silicon film 504 is irradiated from above with a laser beam 507 of an excimer laser to melt the amorphous silicon film 504. The thermal diffusion rate in the longitudinal direction (in the direction of the substrate thickness) for the amorphous silicon film 504 situated above the gap spaces 506 is smaller than that for the amorphous oxide film 504 situated above the silicon oxide film in the form of pillars. This generates a thermal gradient within the amorphous silicon film 504 of the molten state and, in consequence, crystal nuclei are formed in the amorphous silicon film 504 situated above the outline of the pillars-shaped silicon oxide film 502, and with these crystal nuclei serving as seeds, crystals grow in the transverse direction (in the direction of the substrate surface plane) as shown in FIG. 12, and thereby grains 508 are selectively formed. Further, the amorphous silicon other than that forming grains 508 becomes microcrystals 509.

Figure 13:
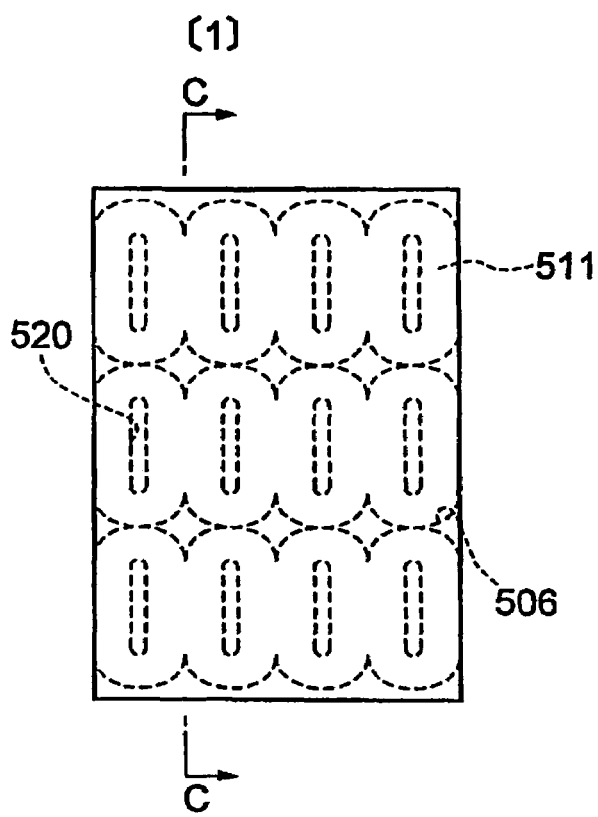
FIG. 13 is a pair of schematic views illustrating Example 3 of the present invention (the sixth part), in which a plan view thereof is shown in FIG. 13(1) and a vertical sectional view taken on line C-C of FIG. 13(1), in FIG. 13(2).
Figure 13:
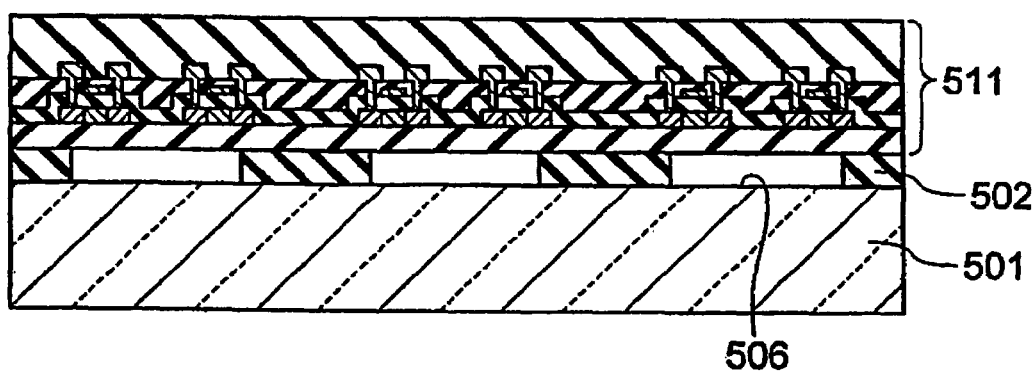
Figure 14:
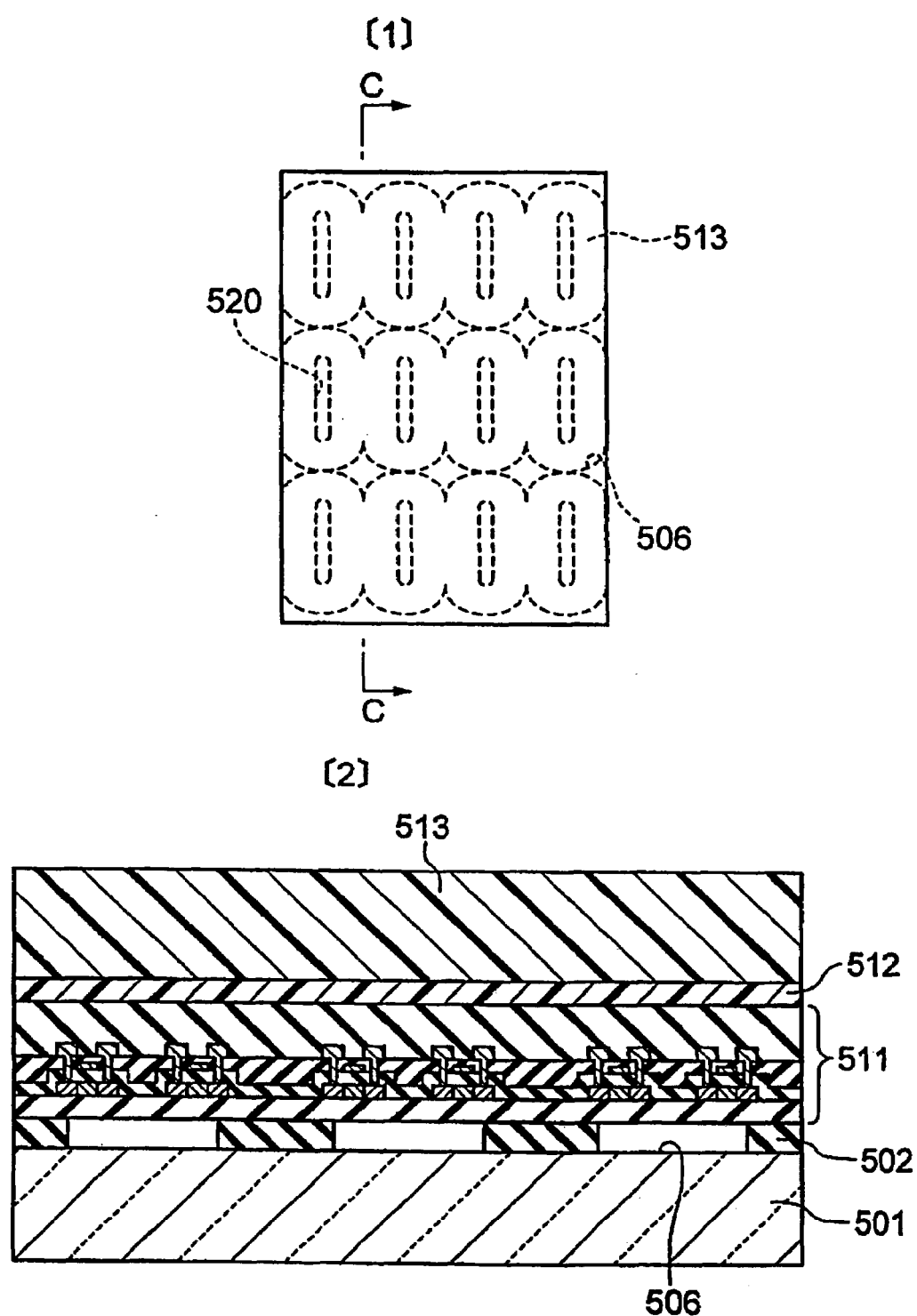
FIG. 14 is a pair of schematic views illustrating Example 3 of the present invention (the seventh part), in which a plan view thereof is shown in FIG. 14(1) and a vertical sectional view taken on line C-C of FIG. 14(1), in FIG. 14(2).

Subsequently, as shown in FIG. 13, with these grains 508 being used as an active layer, TFTs 511 are formed. The structure of the TFT 511 is the same as shown in FIG. 2. After that, as shown in FIG. 14, a plastic substrate 513 is bonded onto the top of the TFT 511 by way of an adhesion layer 512.

Figure 15:
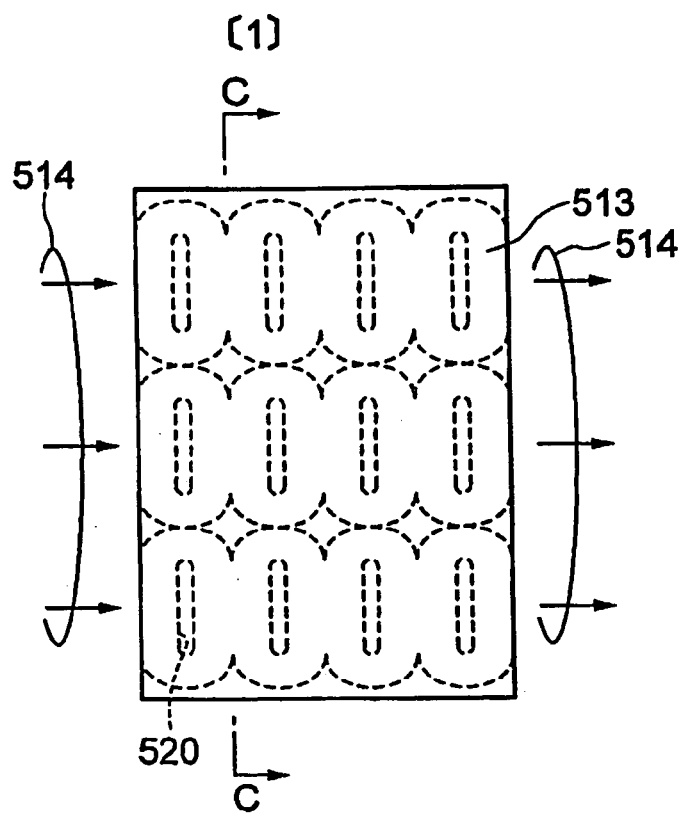
FIG. 15 is a pair of schematic views illustrating Example 3 of the present invention (the eighth part), in which a plan view thereof is shown in FIG. 15(1) and a vertical sectional view taken on line C-C of FIG. 15(1), in FIG. 15(2).
Figure 15:
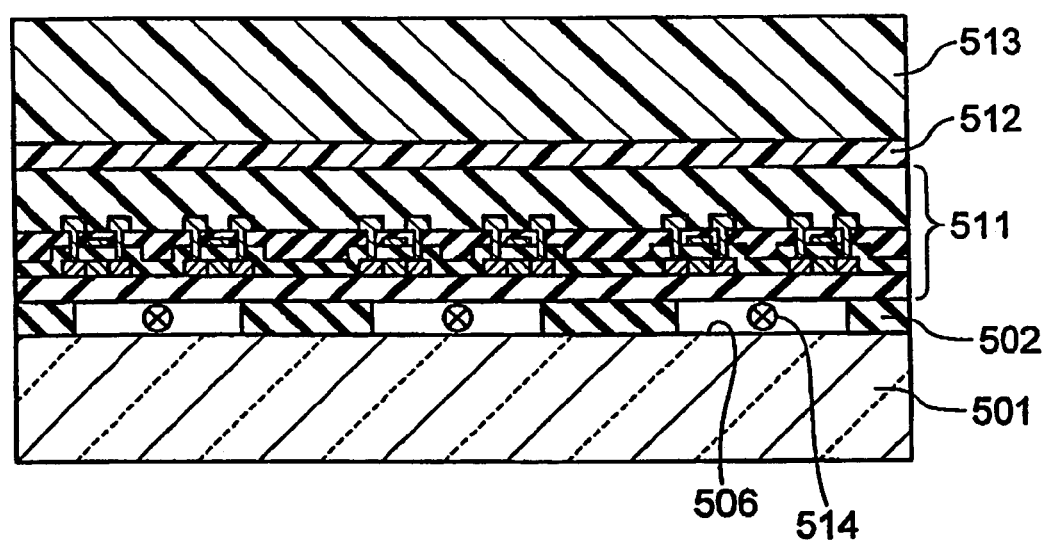
Figure 16:
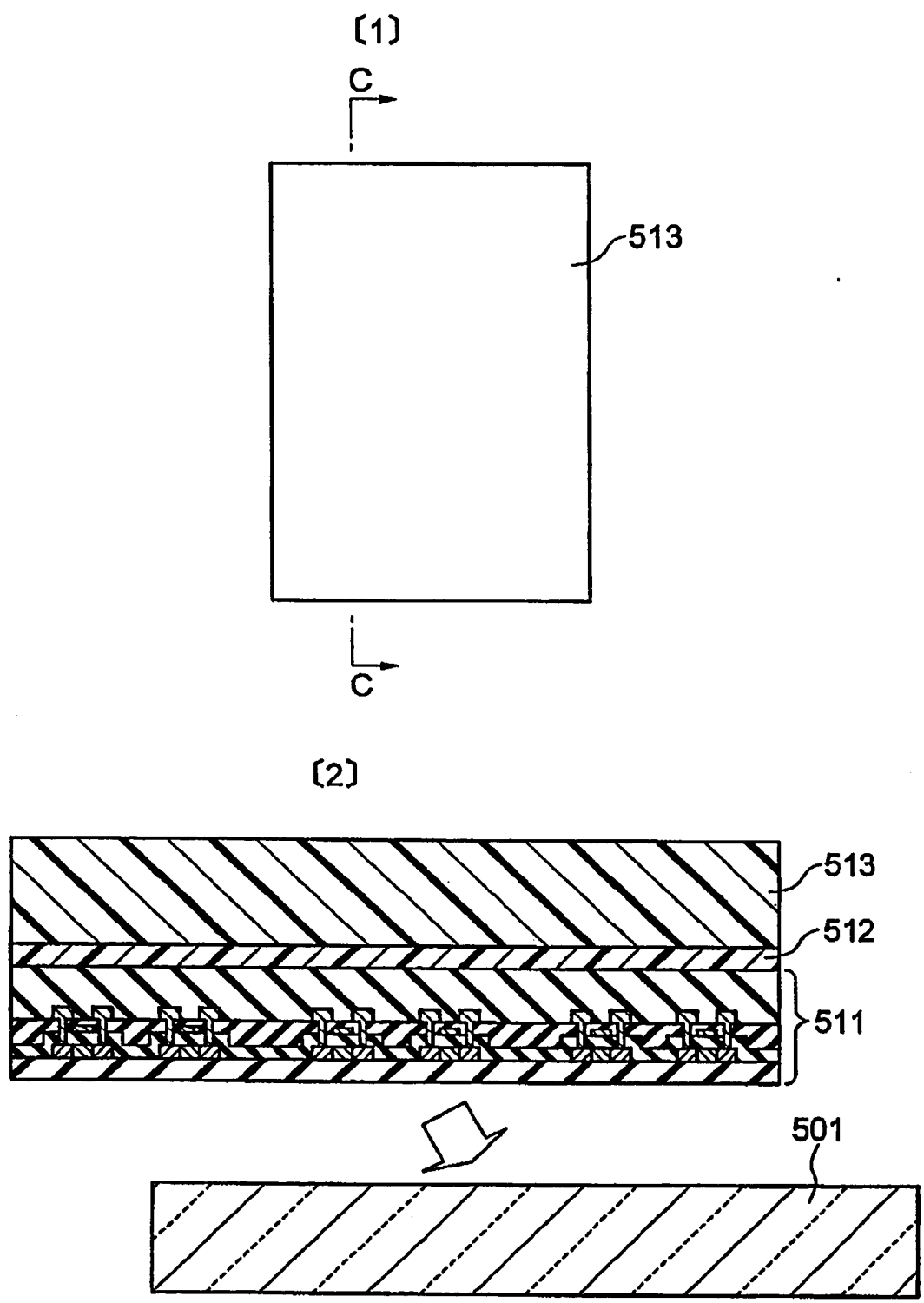
FIG. 16 is a pair of schematic views illustrating Example 3 of the present invention (the ninth part), in which a plan view thereof is shown in FIG. 16(1) and a vertical sectional view taken on line C-C of FIG. 16(1), in FIG. 16(2).
Figure 17:
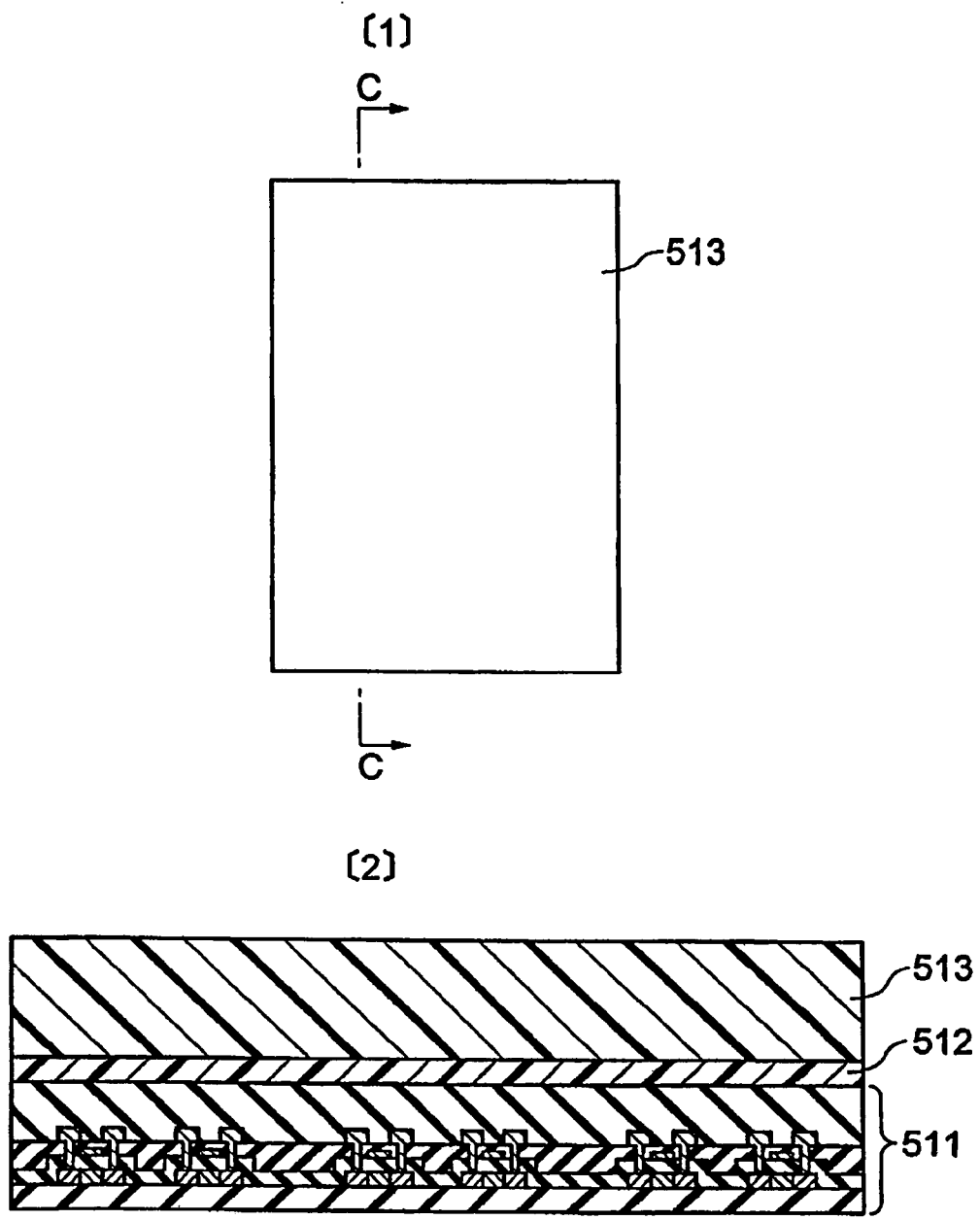
FIG. 17 is a pair of schematic views illustrating Example 3 of the present invention (the tenth part), in which a plan view thereof is shown in FIG. 17(1) and a vertical sectional view taken on line C-C of FIG. 17(1), in FIG. 17(2).

Next, as shown in FIG. 15, a layered structure between the glass substrate 501 and the plastic substrate 513 is immersed into hydrofluoric acid 514. The hydrofluoric acid 514 penetrates from the transverse direction of the glass substrate 501, and permeates through the gap spaces 506 into the whole silicon oxide film 502 which is left in the form of the pillars. This induces hydrofluoric acid 513 to etch the pillars-shaped silicon oxide film 502, and consequently, as shown in FIG. 16, the glass substrate 501 can be peeled off. Now, as shown in FIG. 17, the transfer of the TFTs 511 is completed.

Further, as a substitute for the silicon oxide film 502, any one of metals, semiconductors and insulators can be used, but a material with a low thermal conductivity is preferably used so that a crystalline silicon film of large grain size may be obtained.

FOURTH EXAMPLE

FIGS. 18-25 are pairs of schematic views illustrating Example 4 of the present invention, each pair showing a plan view and a cross-sectional view. The steps of a manufacturing method thereof proceeds in the order of FIG. 18, FIG. 19, FIG. 20, FIG. 21, FIG. 22, FIG. 23, FIG. 24 and FIG. 25. Referring to these drawings, the embodiment of the present invention is described below.

Figure 18:
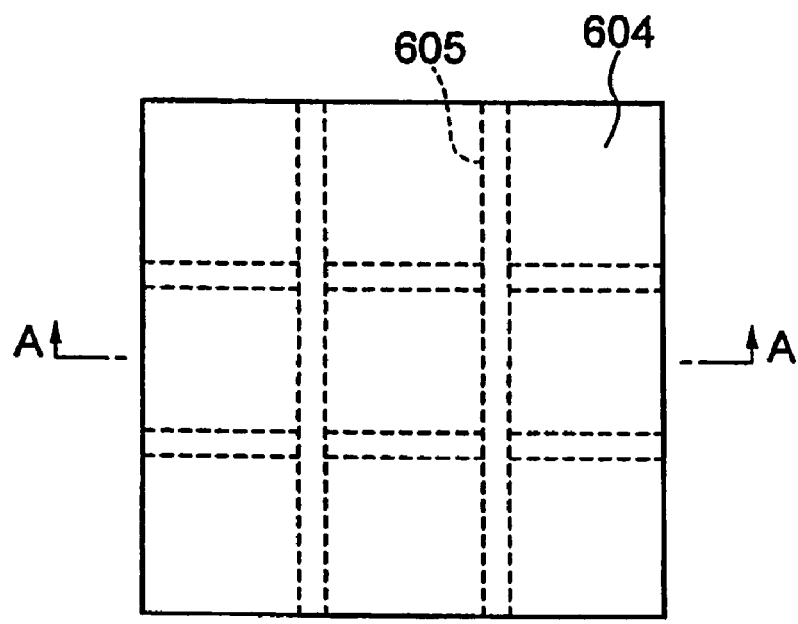
FIG. 18 is a pair of schematic views illustrating Example 4 of the present invention (the first part), in which a plan view thereof is shown in FIG. 18(1) and a vertical sectional view taken on line A-A of FIG. 18(1), in FIG. 18(2).
Figure 18:
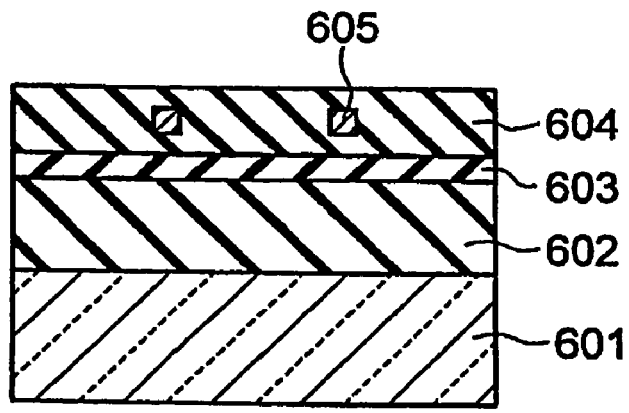

Firstly, as shown in FIG. 18, on a glass substrate 601, a silicon oxide film 602 and a silicon nitride film 603 are formed in succession, and then along with forming ordinary TFTs (not shown in the drawings), interconnections 605 covered with an interlayer insulating film 604 are formed. The silicon oxide film 602 is to serve as a heat insulating film (a film having gap spaces). The silicon nitride film 603 is formed by the plasma CVD. In this instance, hydrogen is fed into the CV chamber as a source gas, whereby a silicon nitride film 603 containing a considerable amount of hydrogen is formed. In this way, the etching rate of the silicon nitride film 603 by hydrofluoric acid can be made very small in comparison with that of silicon oxide.

Figure 19:
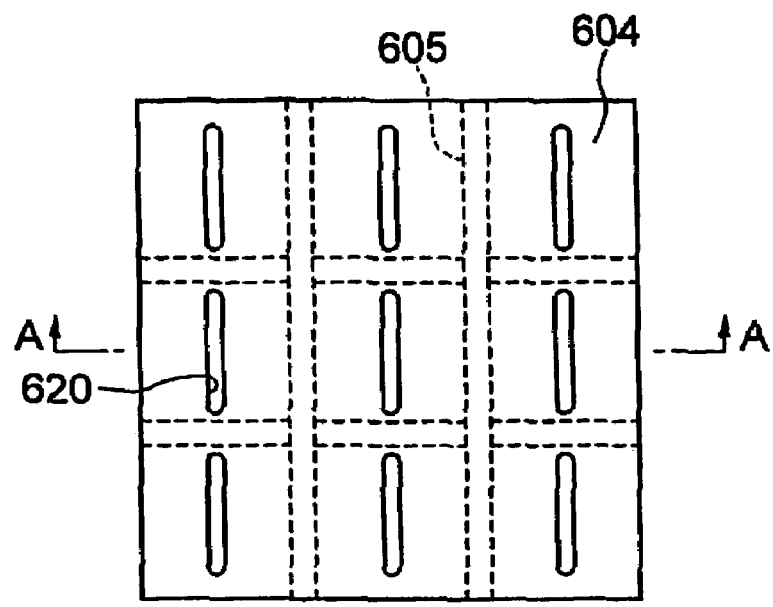
FIG. 19 is a pair of schematic views illustrating Example 4 of the present invention (the second part), in which a plan view thereof is shown in FIG. 19(1) and a vertical sectional view taken on line A-A of FIG. 19(1), in FIG. 19(2).
Figure 19:
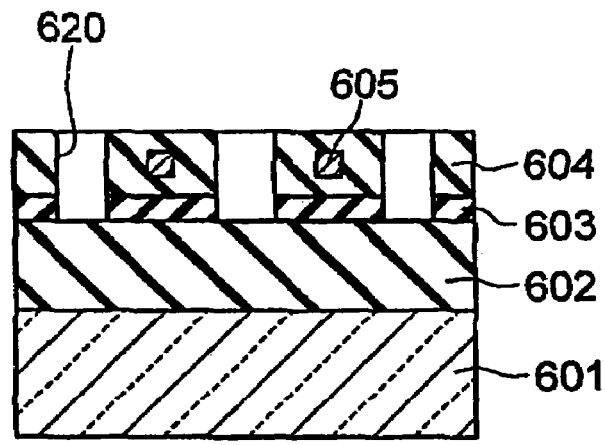

Next, as shown in FIG. 19, a photoresist film (not shown in the drawings) having a pattern with numerous long holes is formed by photolithography, and the silicon nitride film 603 and the interlayer insulating film 604 are etched by means of dry etching down to the silicon oxide film 602, whereby numerous etchant supply holes 620 are formed to reach the silicon oxide film 602.

Figure 20:
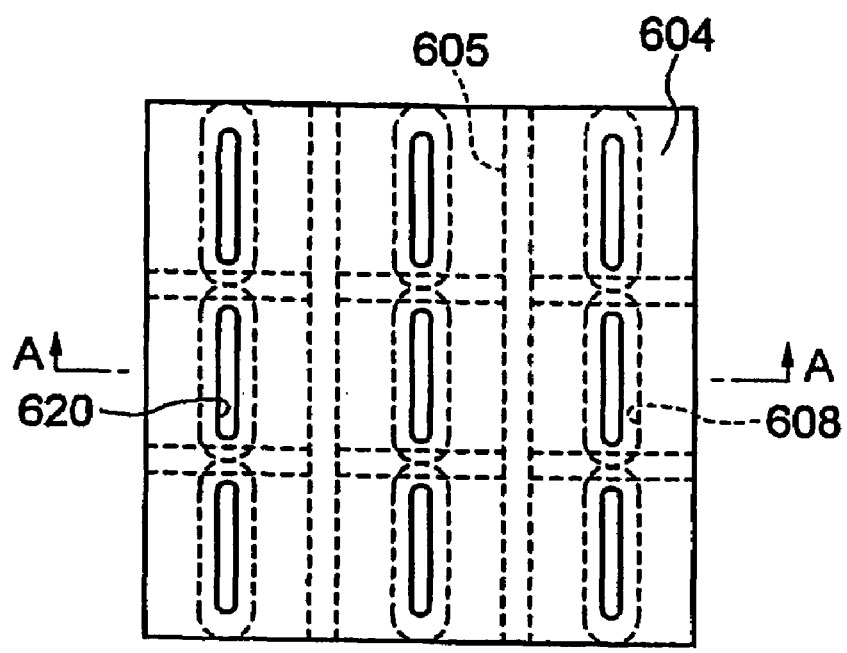
FIG. 20 is a pair of schematic views illustrating Example 4 of the present invention (the third part), in which a plan view thereof is shown in FIG. 20(1) and a vertical sectional view taken on line A-A of FIG. 20(1), in FIG. 20(2).
Figure 20:
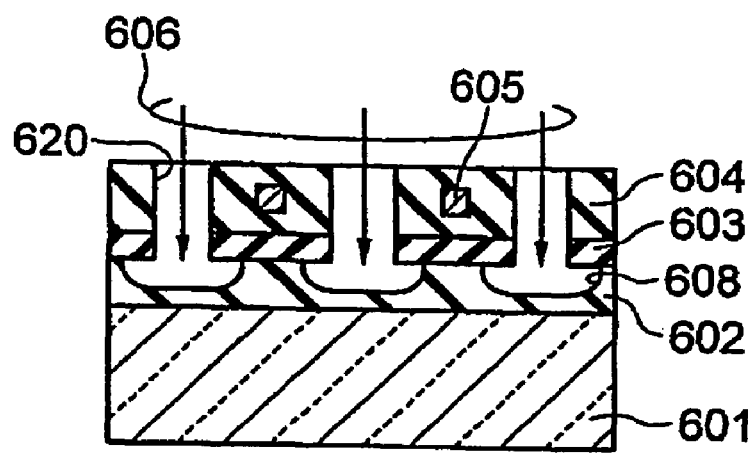

Subsequently, as shown in FIG. 20, the glass substrate 601 wherein the etchant supply holes 620 have been formed is immersed into hydrofluoric acid 606. Since the etching rate of the silicon nitride film 603 is lower than that of the silicon oxide film 602, etched regions in the silicon oxide film 602 expand elliptically, centering around respective etchant supply holes 620, and gap spaces 608 are formed, which results in a structure wherein the flat silicon nitride film 603 and such overlie the silicon oxide film 602 remaining in the form of pillars. The etching hereat is isotropic wet etching so that the gap spaces 608 expand even under the TFTs and the interconnections 605.

Figure 21:
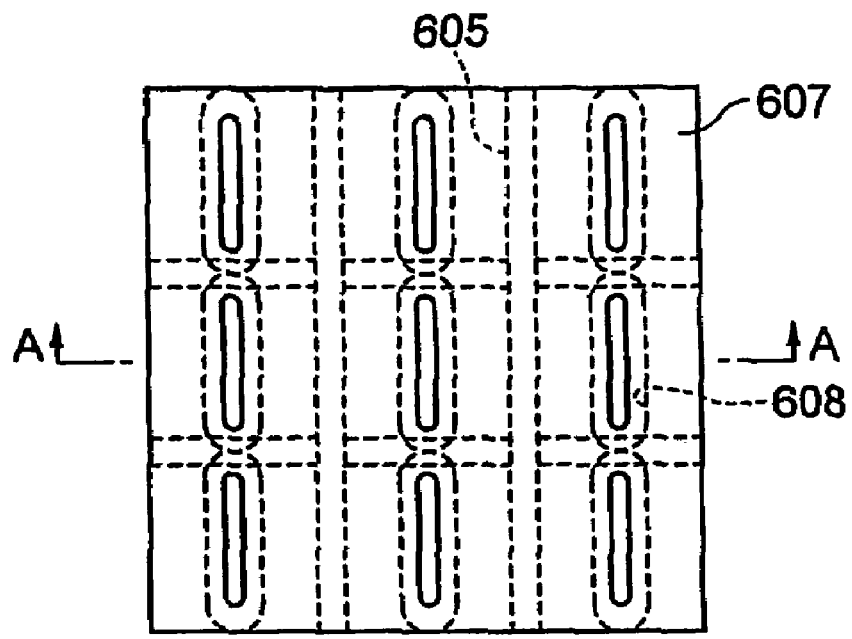
FIG. 21 is a pair of schematic views illustrating Example 4 of the present invention (the fourth part), in which a plan view thereof is shown in FIG. 21(1) and a vertical sectional view taken on line A-A of FIG. 21(1), in FIG. 21(2).
Figure 21:
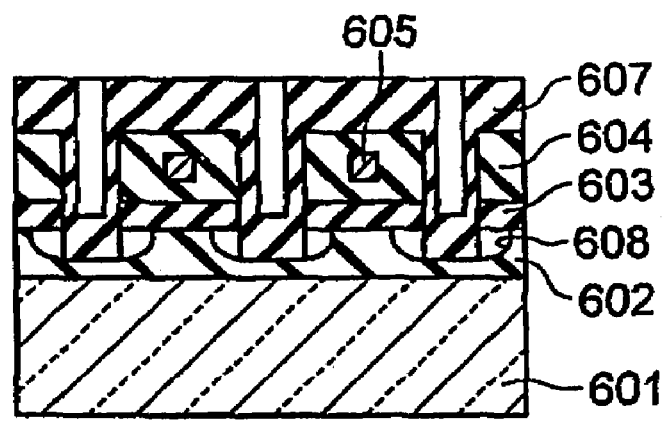
Figure 22:
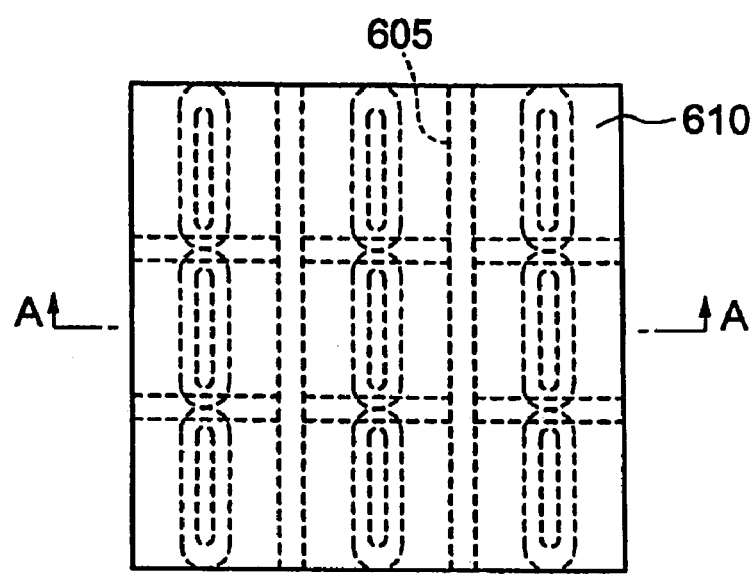
FIG. 22 is a pair of schematic views illustrating Example 4 of the present invention (the fifth part), in which a plan view thereof is shown in FIG. 22(1) and a vertical sectional view taken on line A-A of FIG. 22(1), in FIG. 22(2).
Figure 22:
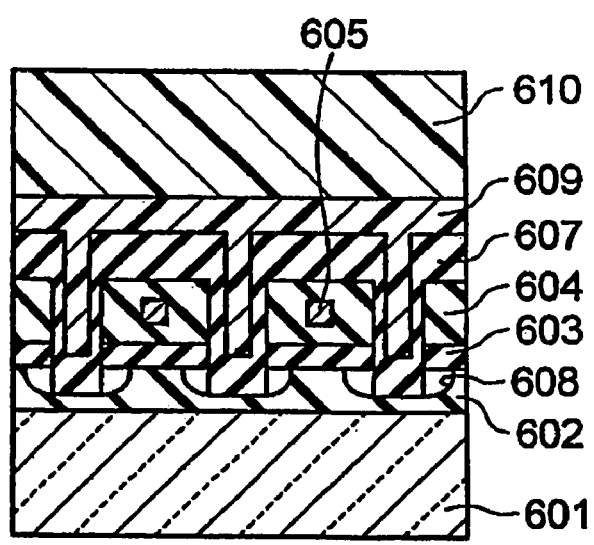

Subsequently, as shown in FIG. 21, on the interlayer insulating film 604 and the gap spaces 608, a silicon nitride film 607 is formed. After that, as show in FIG. 22, a plastic substrate 610 is bonded onto the silicon nitride film 607 by way of an adhesion layer 609.

Figure 23:
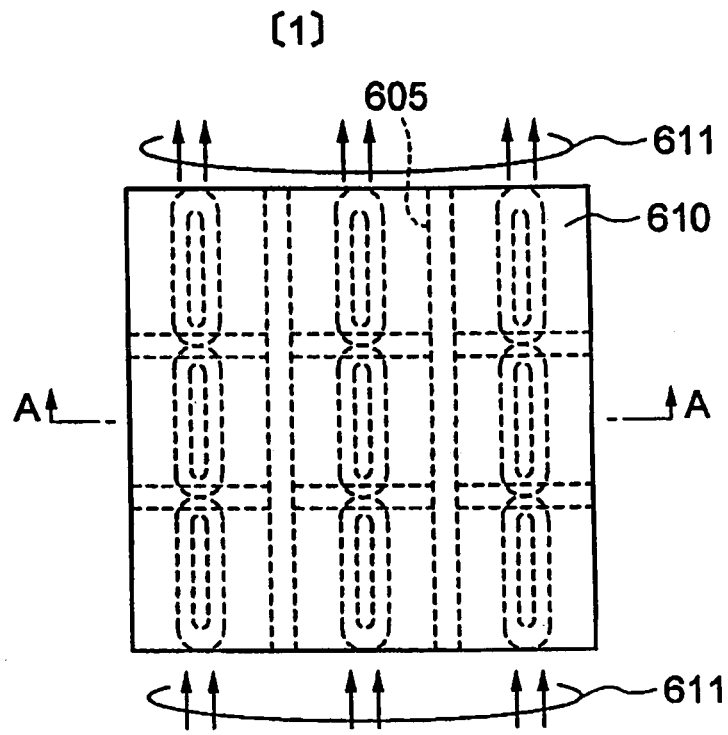
FIG. 23 is a pair of schematic views illustrating Example 4 of the present invention (the sixth part), in which a plan view thereof is shown in FIG. 23(1) and a vertical sectional view taken on line A-A of FIG. 23(1), in FIG. 23(2).
Figure 23:
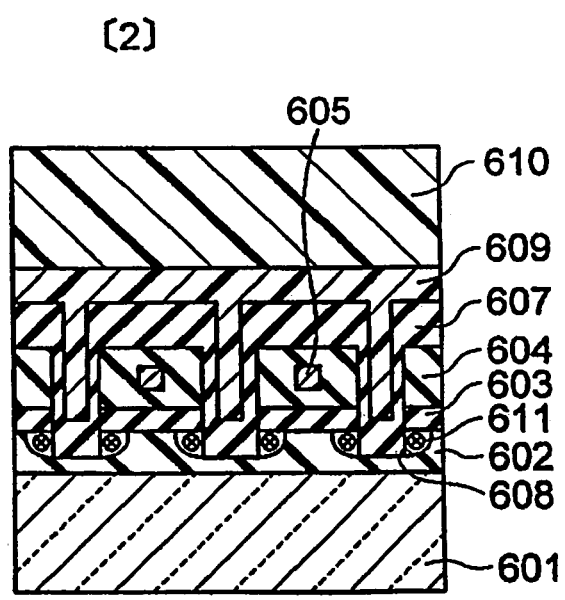
Figure 24:
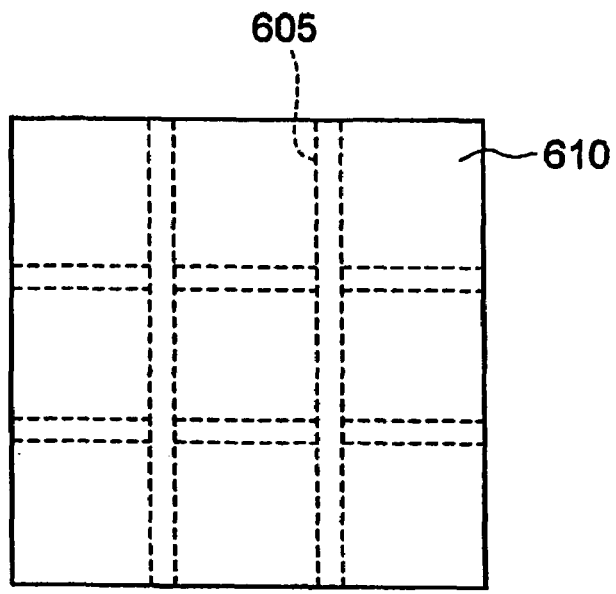
FIG. 24 is a pair of schematic views illustrating Example 4 of the present invention (the seventh part), in which a plan view thereof is shown in FIG. 24(1) and a vertical sectional view taken on line A-A of FIG. 24(1), in FIG. 24(2).
Figure 24:
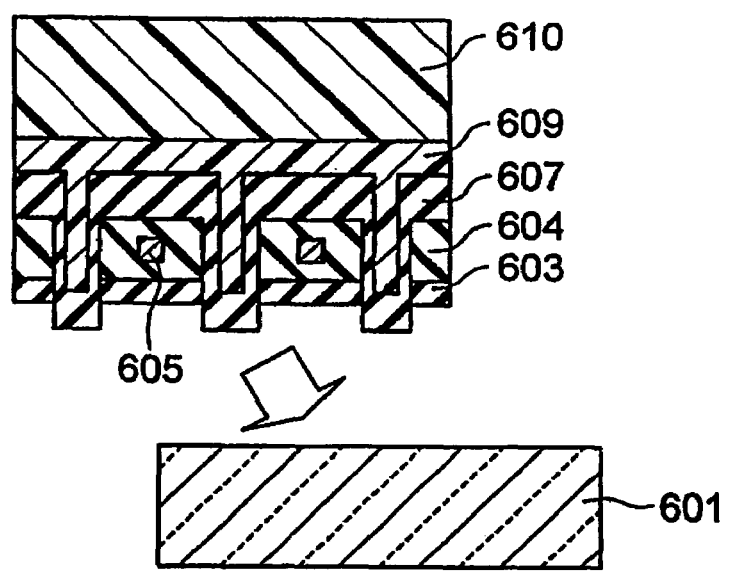
Figure 25:
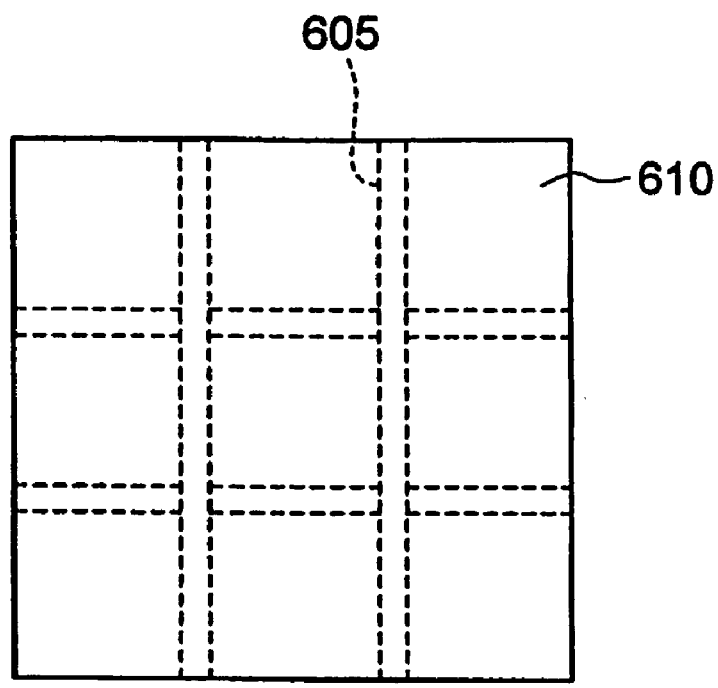
FIG. 25 is a pair of schematic views illustrating Example 4 of the present invention (the eighth part), in which a plan view thereof is shown in FIG. 25(1) and a vertical sectional view taken on line A-A of FIG. 25(1), in FIG. 25(2).
Figure 25:
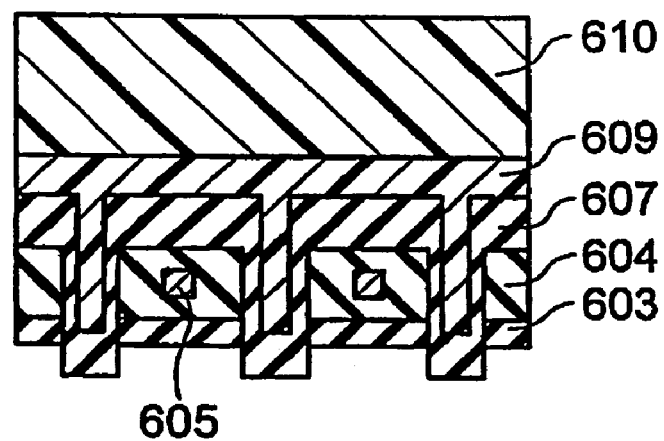

Next, as shown in FIG. 23, a layered structure between the glass substrate 601 and the plastic substrate 610 is immersed into hydrofluoric acid 611. As the gap spaces 608 have been set through the whole silicon oxide film 602 even under the region where the interconnections 605 are present, the hydrofluoric acid 611 permeates through the gap spaces 608 into the whole silicon oxide film 602. Therefore, as shown in FIG. 24, the glass substrate 601 can be peeled off by way of the silicon oxide film 603. Now, as shown in FIG. 25, the transfer of the TFTs and the interconnections 605 is completed.

FIFTH EXAMPLE

Figure 26:
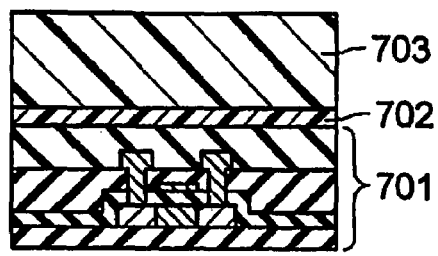
FIG. 26 is a series of schematic cross-sectional views illustrating Example 5 of the present invention and the steps of a manufacturing method thereof proceed in the order of FIG. 26(1) to FIG. 26(4).
Figure 26:
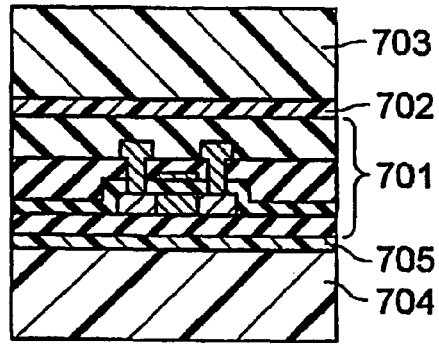
Figure 26:
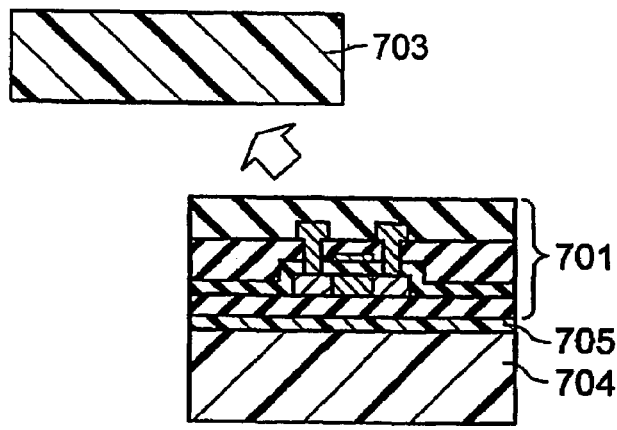
Figure 26:
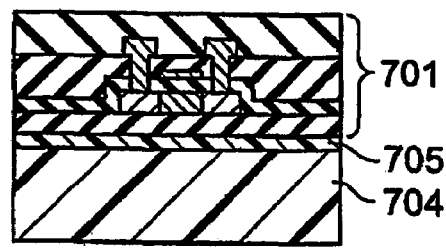

The terminal connection method (the method of bringing out a terminal) for the TFT substrate in Examples 1-4 is described below. Firstly, as shown in FIG. 26 (1), by the method described in Examples 1-4, a primary transfer substrate 703 is adhered to the top of the TFT 701 by way of the adhesion layer 702. Hereat, for the adhesion layer 702, a water-soluble material is employed. Next, as shown in FIG. 26(2), a plastic substrate is adhered, as a secondary transfer substrate 704, to the back of the TFT 701 by way of the adhesion layer 705, which is water insoluble. Next, as shown in FIG. 26(3), by dissolving the adhesion layer 702 with water, the primary transfer substrate 703 is peeled off. After that, in the state shown in FIG. 26(4), the terminal can be brought out by the step of performing photolithography, etching and such.

There can be used another method wherein the adhesion layer 702 for the primary transfer substrate 703 and the adhesion layer 705 for the secondary transfer substrate 704 are each formed of materials with different melt temperatures in such a way that by conducting a heat treatment, only the primary transfer substrate 703 is peeled off. With respect to the primary transfer substrate 703 and the secondary transfer substrate 704, it is not necessary to be a plastic substrate, and a glass substrate, a metal substrate or a layered substrate of two or more of these layers can be utilized. The thermal conductivity of the transfer substrates are preferably set about the same as or greater than that of silicon oxide.

SIXTH EXAMPLE

Figure 27:
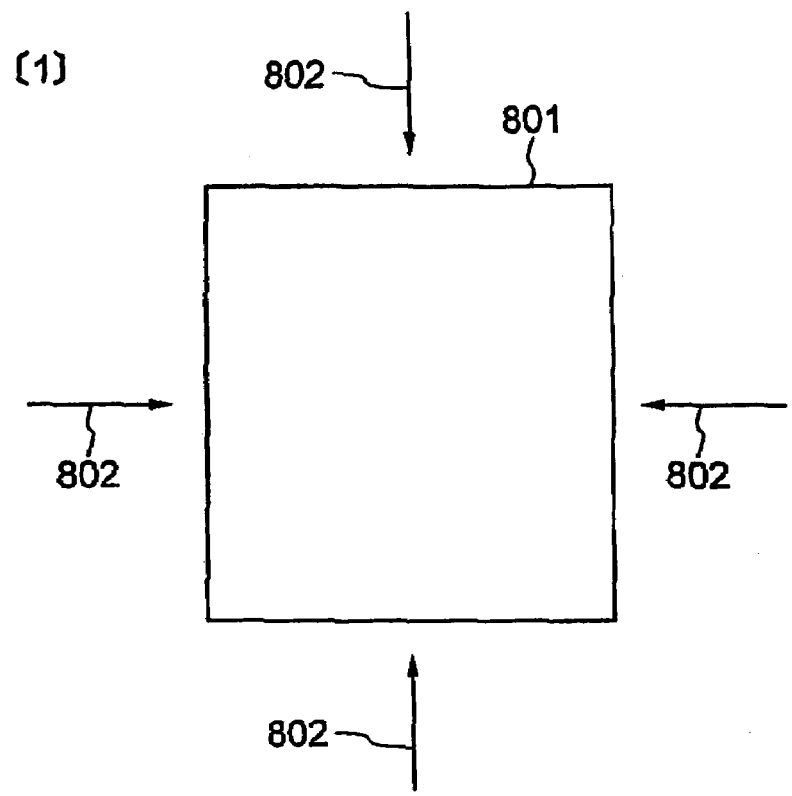
FIG. 27 is a series of schematic plan views illustrating Example 6 of the present invention and the steps of a manufacturing method thereof proceed in the order of FIG. 27(1) to FIG. 27(2).
Figure 27:
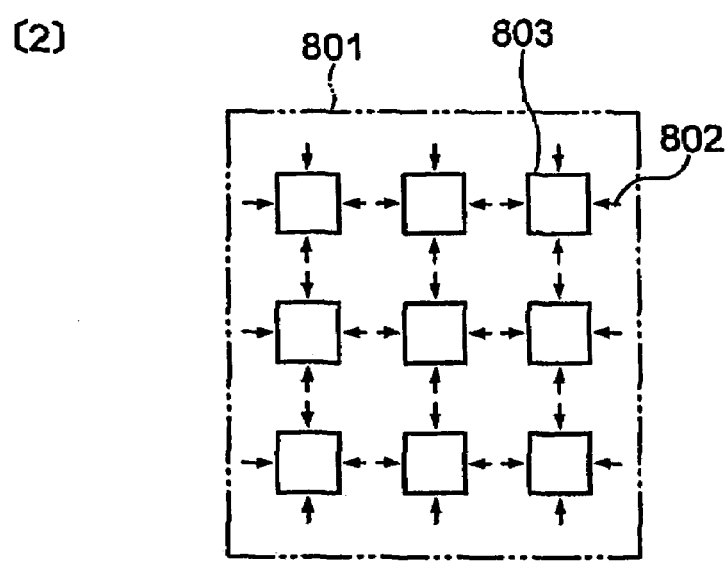

In Examples 1-4, as shown in FIG. 27(1), the greater the area of the layered structure 801 between the glass substrate and the plastic substrate is, the longer the time period for the etchant 802 to penetrate deep into the structure with gap spaces becomes. Accordingly, after the plastic substrate is bonded thereto, the layered structure 801 is cut into sections of prescribed size, making numerous small layered structures 803, as shown in FIG. 27(2). This shortens the distance for the etchant 802 to penetrate into in the step of peeling off a substrate; and thus, the step can be completed in a shorter period of the time.

What is claimed is:

1. A method of manufacturing a thin film device substrate; comprising the steps of:
    forming, on a first substrate, a heat insulating film to hinder heat conduction;
    forming a semiconductor film on said heat insulating film;
    applying laser annealing to said semiconductor film;
    forming a thin film device with said semiconductor film which has been subjected to the laser annealing;
    bonding a second substrate onto said thin film device; and
    peeling off said first substrate and said heat insulating film from a layered structure between said first substrate and said second substrate inclusive, wherein,
    said heat insulating film is a film having a gap space,
    said gap space is formed by means of etching, and
    the step of forming a heat insulating film on a first substrate comprising the steps of:
    forming, on said first substrate, a primary film in which said gap space is to be formed in a subsequent step;
    forming, in a film formed on said primary film, a large number of through holes to reach said primary film; and
    supplying an etchant from said through holes and thereby forming said gap space in said primary film.

2. A method of manufacturing a thin film device substrate according to claim 1, wherein said film having a gap space is a porous film.

3. A method of manufacturing a thin film device substrate according to claim 1, wherein the step of peeling off said first substrate and said heat insulating film comprises the step of supplying said etchant into said gap space and thereby removing said heat insulating film.

4. A method of manufacturing a thin film device substrate according to claim 1, wherein the step of peeling off said first substrate and said heat insulating film comprises the step of breaking said heat insulating film mechanically.

5. A method of manufacturing a thin film device substrate according to claim 1, wherein said heat insulating film is made of silicon oxide.

6. A method of manufacturing a thin film device substrate according to claim 1; which further comprises the step of forming, under said heat insulating film, a peeling-off film that is to be peeled off in a subsequent step; wherein
    the step of peeling off said first substrate and said heat insulating film comprises the steps of removing said peeling-off film and removing said heat insulating film.

7. A method of manufacturing a thin film device substrate according to claim 6, wherein said heat insulating film is made of a film having a gap space; and
    the step of removing said peeling-off film comprises the step of making an etchant permeate through said gap space and thereby etching said peeling-off film.

8. A method of manufacturing a thin film device substrate according to claim 7, wherein said peeling-off film is made of chromium and said heat insulating film is made of porous silicon oxide.

9. A method of manufacturing a thin film device substrate according to claim 6, wherein the step of peeling off said first substrate and said heat insulating film comprises the step of breaking mechanically, at least, one of said heat insulating film and said peeling-off film.

10. A method of manufacturing a thin film device substrate according to claim 1, wherein said semiconductor film is made of silicon.

11. A method of manufacturing a thin film device substrate according to claim 1, wherein said thin film device is a thin film transistor.

12. A method of manufacturing a thin film device substrate, comprising the steps of:
    forming, on a first substrate, a heat insulating film to hinder heat conduction;
    forming a semiconductor film on said heat insulating film;
    applying laser annealing to said semiconductor film;
    forming a thin film device with said semiconductor film which has been subjected to the laser annealing;
    bonding a second substrate onto said thin film device;
    peeling off said first substrate and said heat insulating film from a layered structure between said first substrate and said second substrate inclusive; and
    forming, over said heat insulating film, a peeling-off film that is to be peeled off in a subsequent step,
    wherein the step of peeling off said first substrate and said heat insulating film comprises the step of removing said peeling-off film,
    said heat insulating film is made of a film having a gap space; and
    the step of removing said peeling-off film comprises the step of making an etchant permeate through said gap space and thereby etching said peeling-off film.

13. A method of manufacturing a thin film device substrate according to claim 12, wherein said peeling-off film is made of chromium and said heat insulating film is made of porous silicon oxide.

14. A method of manufacturing a thin film device substrate according to claim 12, wherein the step of peeling off said first substrate and said heat insulating film comprises the step of breaking mechanically, at least, one of said heat insulating film and said peeling-off film.

15. A method of manufacturing a thin film device substrate,
    comprising the steps of:
    forming, on a first substrate, a heat insulating film to hinder heat conduction;
    forming a semiconductor film on said heat insulating film;
    applying laser annealing to said semiconductor film;
    forming a thin film device with said semiconductor film which has been subjected to the laser annealing;
    bonding a second substrate onto said thin film device; and
    peeling off said first substrate and said heat insulating film from a layered structure between said first substrate and said second substrate inclusive, wherein the step of peeling off said first substrate and said heat insulating film comprises the step of dividing said layered structure into a plural number, prior to said peeling-off.

16. A method of manufacturing a thin film device substrate; which comprises the steps of:
 forming, on a first substrate, a heat insulating film to hinder heat conduction;
 forming a semiconductor film on said heat insulating film;
 applying laser annealing to said semiconductor film;
 bonding a second substrate onto said semiconductor film which has been subjected to the laser annealing;
 peeling off said first substrate and said heat insulating film from a layered structure between said first substrate and said second substrate inclusive; and
 forming a thin film device with said semiconductor film which has been subjected to the laser annealing, wherein,
 said heat insulating film is a film having a gap space,
 said gap space is formed by means of etching,
 the step of forming a heat insulating film on a first substrate comprises the steps of:
 forming, on said first substrate, a primary film in which said gap space is to be formed in a subsequent step;
 forming, in a film formed on said primary film, a large number of through holes to reach said primary film; and
 supplying an etchant from said through holes and thereby forming said gap space in said primary film.

17. A method of manufacturing a thin film device substrate according to claim 16, wherein said film having a gap space is a porous film.

18. A method of manufacturing a thin film device substrate according to claim 16, wherein the step of peeling off said first substrate and said heat insulating film comprises the step of supplying said etchant into said gap space and thereby removing said heat insulating film.

19. A method of manufacturing a thin film device substrate according to claim 16, wherein the step of peeling off said first substrate and said heat insulating film comprises the step of breaking said heat insulating film mechanically.

20. A method of manufacturing a thin film device substrate according to claim 16, wherein said heat insulating film is made of silicon oxide.

21. A method of manufacturing a thin film device substrate according to claim 16;
 further comprising the step of forming, over said heat insulating film, a peeling-off film that is to be peeled off in a subsequent step; and
 wherein the step of peeling off said first substrate and said heat insulating film comprises the step of removing said peeling-off film.

22. A method of manufacturing a thin film device substrate according to claim 21, wherein
 the step of removing said peeling-off film comprises the step of making an etchant permeate through said gap space and thereby etching said peeling-off film.

23. A method of manufacturing a thin film device substrate according to claim 22, wherein said peeling-off film is made of chromium and said heat insulating film is made of porous silicon oxide.

24. A method of manufacturing a thin film device substrate according to claim 21, wherein the step of peeling off said first substrate and said heat insulating film comprises the step of breaking mechanically, at least, one of said heat insulating film and said peeling-off film.

25. A method of manufacturing a thin film device substrate according to claim 16;
 further comprising the step of forming, under said heat insulating film, a peeling-off film that is to be peeled off in a subsequent step; and
 wherein the step of peeling off said first substrate and said heat insulating film comprises the steps of removing said peeling-off film and removing said heat insulating film.

26. A method of manufacturing a thin film device substrate according to claim 25, wherein
 the step of removing said peeling-off film comprises the step of making an etchant permeate through said gap space and thereby etching said peeling-off film.

27. A method of manufacturing a thin film device substrate according to claim 26, wherein
 said peeling-off film is made of chromium and said heat insulating film is made of porous silicon oxide.

28. A method of manufacturing a thin film device substrate according to claim 25, wherein the step of peeling off said first substrate and said heat insulating film comprises the step of breaking mechanically, at least, one of said heat insulating film and said peeling-off film.

29. A method of manufacturing a thin film device substrate according to claim 16, wherein the step of peeling off said first substrate and said heat insulating film comprises the step of dividing said layered structure into a plural number, prior to said peeling-off.

30. A method of manufacturing a thin film device substrate according to claim 16, wherein said semiconductor film is made of silicon.

31. A method of manufacturing a thin film device substrate according to claim 16, wherein said thin film device is a thin film transistor.

* * * * *